(12) United States Patent
Frosien et al.

(10) Patent No.: US 7,763,866 B2
(45) Date of Patent: Jul. 27, 2010

(54) CHARGED PARTICLE BEAM DEVICE WITH APERTURE

(75) Inventors: Jürgen Frosien, Riemerling (DE); Stefan Lanio, Erding (DE); Helmut Banzhof, Pfullingen (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 582 days.

(21) Appl. No.: 10/576,547

(22) PCT Filed: Oct. 19, 2004

(86) PCT No.: PCT/EP2004/011825

§ 371 (c)(1), (2), (4) Date: Mar. 28, 2007

(87) PCT Pub. No.: WO2005/041242

PCT Pub. Date: May 6, 2005

(65) Prior Publication Data

US 2007/0257207 A1    Nov. 8, 2007

(30) Foreign Application Priority Data

Oct. 20, 2003    (EP) ................... 03023826

(51) Int. Cl.
*G21K 5/00* (2006.01)
(52) U.S. Cl. ............... 250/492.23; 250/492.1; 250/492.2
(58) Field of Classification Search ............ 250/492.1, 250/492.2, 492.23
See application file for complete search history.

(56) References Cited

U.S. PATENT DOCUMENTS 3,610,734 A    10/1971    Wollnik et al.

(Continued)

FOREIGN PATENT DOCUMENTS

EP    0 280 375    8/1988

(Continued)

OTHER PUBLICATIONS

PCT International Search Report and Written Opinion dated Mar. 23, 2005 for International Application No. PCT/EP2004/011825.

*Primary Examiner*—David A Vanore
*Assistant Examiner*—Hanway Chang
(74) *Attorney, Agent, or Firm*—Patterson & Sheridan, L.L.P.

(57) ABSTRACT

The present invention relates to a charged particle beam device (1) for inspecting or structuring a specimen (3) comprising a charged particle beam source (5) to generate a charged particle beam (7), a focussing lens (9) to focus the charged particle beam (7) onto the specimen (3), and an aperture system (13) for defining an aperture (6) for the charged particle beam (7). The aperture system (13) includes a first member (20) to block a first portion (7a) of the charged particle beam (7) between the charged particle beam source (5) and the focussing lens (9), a second member (30) to block a second portion (7b) of the charged particle beam (7) between the charged particle beam source (5) and the focussing lens (9), first means (24) for moving the first member (20) to adjust the size of the blocked first portion (7a) of the charged particle beam (7), and second means (34) for moving the second member (30) independently from the first portion (7b). With such aperture system (13), it is possible to freely adjust the size of the aperture (6) and align it to the optical axis (8) during operation.

21 Claims, 16 Drawing Sheets

U.S. PATENT DOCUMENTS

| | | | |
|---|---|---|---|
| 4,899,060 A | 2/1990 | Lischke | |
| 4,963,748 A | 10/1990 | Szilagyi | |
| 5,065,034 A | 11/1991 | Kawanami et al. | |
| 2004/0149935 A1* | 8/2004 | Nakasugi | 250/492.22 |

FOREIGN PATENT DOCUMENTS

| | | |
|---|---|---|
| EP | 0 548 899 | 6/1993 |
| EP | 0 660 370 | 6/1995 |
| JP | 55003620 | 1/1980 |
| JP | 61255022 | 11/1986 |

* cited by examiner

CHARGED PARTICLE BEAM DEVICE WITH APERTURE

FIELD OF THE INVENTION

The invention relates to a charged particle beam device for inspecting or structuring a specimen. In particular, the present invention relates to a focussing charged particle beam device comprising an aperture for shaping the aperture angle of the charged particle beam.

BACKGROUND OF THE INVENTION

Charged particle beam devices are becoming increasingly important for imaging and structuring micro- and nanometer sized structures and devices. While electron beams are preferred for imaging, ion beams are more suitable for machining a specimen, for example, by using the ion beam for etching, cutting or deposition.

For inspecting or structuring a specimen efficiently with a high spatial resolution, it is important that the aperture of the charged particle beam device is well matched to the operational set up. For example, for obtaining minimum charged particle beam spot size, or a maximum beam current at a given beam spot size, the aperture has to be optimized with respect to aberrations of the lenses involved in the charged particle beam device, to diffraction which depends on the wavelength of the charged particles, to particle beam current which influences Coulomb interaction, and to system magnification.

FIG. 1 illustrates schematically, as an example, a scanning charged particle beam device 1 having a charged particle beam source 5 that emits a charged particle beam 7, an extraction electrode 11 to accelerate the charged particles of the charged particle beam 7 to a desired beam energy, an aperture system 13 to define aperture angle α and beam current, and a focussing lens 9 to focus the charged particle beam onto a specimen 3. For completeness, FIG. 1 also depicts a scanning system 17 to scan the charged particle beam 7 across the surface of the specimen 3.

The aperture system 13 of FIG. 1 depicts schematically three different circular apertures 13a, 13b and 13c which enable a person to operate the charged particle beam device at three different beam currents and aperture angles α. In the case of FIG. 1, the aperture angle α is defined by the maximum angle with respect to the optical axis 8 at which a ray of charged particles can pass through the opening 13a. Accordingly, the aperture angle α is defined by the diameter D of the opening 13a, and the distance L between the charged particle beam source 5 and the opening 13a The three different apertures 13a, 13b, 13c can be selected by using aperture drive 15 to linearly move one of the three apertures into the charged particle beam 7.

The openings of the apertures 13a, 13b, 13c, of FIG. 1 are circular to provide that the respective aperture can be aligned to be fully rotational symmetric with respect to the optical axis 8. With full rotational symmetry, the aperture angle α is independent of the plane within which the aperture angle α is taken. Therefore, a fully rotationally symmetric aperture usually provides the highest focussing quality compared to systems with apertures of less rotational symmetry.

However, the aperture system 13 of FIG. 1 with the three opening 13a, 13b, 13c, allows for only three different aperture angles α to optimize beam current and beam resolution. While it is true that aperture system 13 may be designed to have more than the three apertures of FIG. 1, the total number of apertures of a aperture system is always limited by tight space limitations and the constraint not to deter the electric field configuration within the beam column.

Further, when shifting aperture system 13 to change from one aperture with a first diameter D to another aperture with a second diameter, beam operation is interrupted. Such interruptions make it difficult to adjust the aperture during operation. In addition, changing the aperture by shifting aperture system 13 requires each time an alignment procedure to align the new aperture to the optical beam axis. Such alignment procedure is generally time consuming.

Further, permanent exposure of the aperture system 13 of FIG. 1 to a charged particle beam usually causes the aperture defining edges to change over time. For example, exposure to an electron beam generally leads to a contamination of the edges, while exposure to an ion beam generally leads to a removal of the aperture defining material. Both effects cause the aperture angle to drift over time which in turn causes beam spot size and beam current to vary uncontrollably.

SUMMARY OF THE INVENTION

It is therefore a first aspect of the present invention to provide a charged particle beam device which does not show the above mentioned problems.

It is yet a further aspect of the present invention to provide a charged particle beam device which provides more flexibility for adjusting the aperture size to optimize spatial resolution and beam current for any given application.

It is yet a further aspect of the present invention to provide a charged particle beam device where focussing and beam current performance do not uncontrollably change due to deforming aperture shape or size induced by high beam exposure.

Further advantages, features, aspects, and details of the invention are evident from the dependent claims, the description and the accompanying drawings. The claims are intended to be understood as a first non-limiting approach of defining the invention in general terms.

The charged particle beam device according to claim 1 comprises a charged particle beam source to generate a charged particle beam, a focussing lens to focus the charged particle beam onto the specimen, and an aperture system which comprises a first member to block a first portion of the charged particle beam between the charged particle beam source and the focussing lens, a second member to block a second portion of the charged particle beam between the charged particle beam source and the focussing lens, first means for moving the first member to adjust the size of the blocked first portion of the charged particle beam, and second means for moving the second member independently of the first member.

The present invention therefore is based on the idea to provide the aperture system with at least two independently movable members for defining an aperture angle for the charged particle beam device. This way, the aperture angle can be gradually increased by moving the at least two members in opposite directions away from the charged particle beam, and gradually decreased by moving the at least two members towards each other towards the charged particle beam. The fact that an aperture can be gradually increased or decreased enormously simplifies the search for an optimum aperture angle for a given application compared to the discrete selection of a limited number of apertures, as described in FIG. 1. Further, the adjustment of the aperture with the aperture system according to the invention can be carried out during beam operation, i.e. without having to interrupt the beam or even break the vacuum. This too greatly accelerates the options for operating and improving the performance of a charged particle beam device.

With the capability of gradually adjusting the aperture angle and the alignment of the aperture with respect to the charged particle beam, position and size of an aperture can be optimized incrementally without having to interrupt probing or structuring of the specimen. This facilitates a fast and easy optimization of aperture size and position for any given application, e.g. for minimizing the size of the charged particle beam spot at a given beam current, or, vice versa, for maximizing the charged particle beam current at a given beam spot size.

The invention therefore is also based on the idea to sacrifice the many advantages inherent in a fully circular aperture for an aperture system whose aperture is less circular but more flexible for defining size and alignment position for any given application.

A further aspect of the present invention is that the movable members of the aperture system according to the invention can be moved with respect to the charged particle beam in a way that exposes different sections of the respective members to the beam without changing the shape of the aperture. This way, sections of the members that begin to deform or contaminate due to too much irradiation by the charged particle beam, can be exchanged during operation by new ones without that aperture changes. This way, the aperture system has a significant longer lifetime which reduces the down time of the charged particle beam device.

A still further aspect of the present invention is that the means for moving a member can be used to align the aperture of the charged particle beam device to the optical axis, without affecting the aperture geometry. This alignment can be carried out during beam operation which makes it easy to determine a correct alignment. Such aperture system can spare the use of deflectors for alignment.

The aperture system according to the invention includes at least two members to independently block a first and a second portion of a charged particle beam. With only two members, it is possible to provide a strip-like shaped cross section of the charged particle beam with a strip-width optimized to deliver a low spatial resolution in the direction of the strip-width and a high resolution in the direction perpendicular thereto. Having a high spatial resolution only within one direction may well be sufficient for applications where spatial resolution is required only within one dimension.

In one preferred embodiment of the invention, the aperture system includes three members to independently block a first, second and third portion of a charged particle beam to define a triangular aperture that fully encircles the charged particle beam. This way, the aperture angles of the charged particle beam device can be fully controlled by the positioning of only three independently movable members. Preferably, the charged particle beam device also includes a magnetic or electric hexapole component to reduce the beam spot size by rounding the three corners of the triangular shaped beam spot obtained from passing the beam through the triangular aperture.

In another preferred embodiment of the invention, the aperture system includes four members to independently block a first, second, third and fourth portion of a charged particle beam. Such aperture system is usually more complicated to build and operate than a system with only two members. However, with four members, it is possible to provide an adjustable rectangular aperture whose length and width can be optimized to deliver a high spatial resolution in two orthogonal dimensions. This makes it possible to deliver a small beam spot size for high spatial resolution in two dimensions.

Preferably, the charged particle beam device with the aperture system of four members also includes a magnetic or electric octupole component. With the octupole component, it is possible to reduce the beam spot size by rounding the four corners of the rectangular shaped beam spot obtained from passing the beam through the aperture system. Since many charged particle beam devices are equipped with a magnetic or electric octupole component anyway, this method of focussing the charged particle beam is often easier to realize than installing and using eight movable members for defining the aperture.

In another preferred embodiment of the invention, the charged particle beam device includes eight members to independently block a first, second, third, fourth, fifth, sixth, seventh and eighth portion of a charged particle beam. Such aperture system is usually more complicated to build and operate than a system with two or four members; however, with eight members, it is possible to provide an adjustable octagonal aperture whose eight sides can be optimized to deliver an even higher spatial resolution than a rectangular aperture can achieve.

BRIEF DESCRIPTION OF THE DRAWINGS

Some of the above indicated and other more detailed aspects of the invention will be described in the following description and partially illustrated with reference to the figures. Therein:

FIG. 5b Blow-up view of the aperture region of the aperture system of FIG. 5a

FIG. 6c Beam spot of the SEM of FIG. 6a with the magnetic octupole switched on.

FIG. 7c Beam spot with triangular aperture system and a magnetic hexapole component switched on.

DESCRIPTION OF THE PREFERRED EMBODIMENTS

Figure 1:
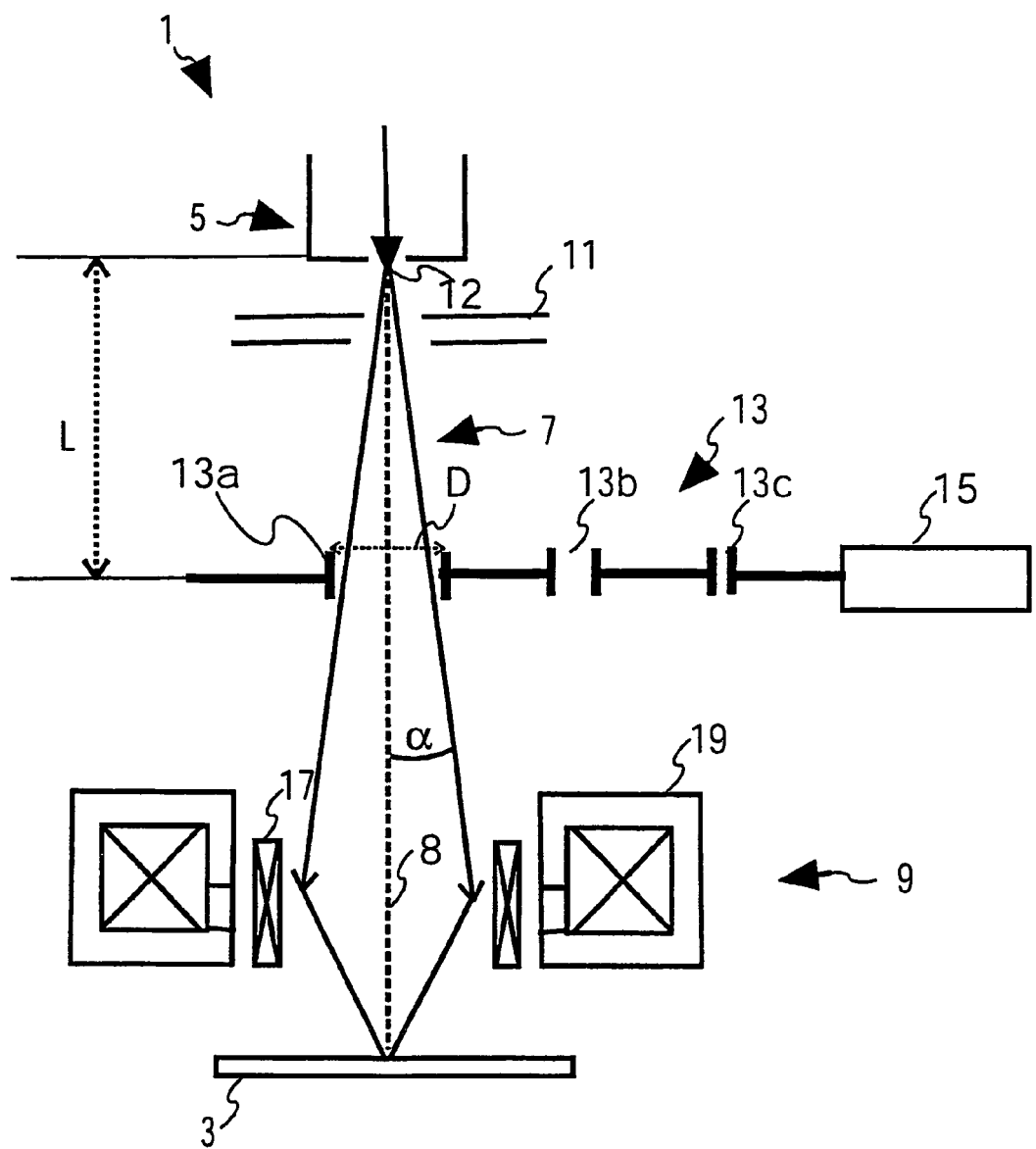
FIG. 1 Scanning electron microscope (SEM) with an aperture system known in the art.

The term "charged particle beam device" in claim 1 refers to any device that uses a charged particle beam to probe or structure a specimen. Preferably, the charged particle beam device is a device for focussing the charged particle beam onto a specimen with a high spatial resolution. Preferably, the charged particle beam device includes a focussing lens for focussing an image of the charged particle beam source onto the specimen. Further, preferred, the charged particle beam device includes an aperture system having an aperture for defining an aperture angle at which the charged particle beam arrives at the focussing lens. Preferably, the aperture serves to limit the spherical and/or chromatic aberrations generated by the focussing lens. Further, depending on the application, a skilled person would know what other beam optical components to include to the charged particle beam device, like condensers, beam boosters, deflectors and the like.

By imaging the charged particle beam source onto the specimen, the charged particle beam device can be used for applications that require the highest possible spatial resolution, e.g. from 1 micrometer down to 1 nanometer. For example, the charged particle beam device may be a scanning particle system for scanning a focussed charged particle beam across the specimen to inspect or structure the specimen. The charged particle beam devices may further be charged particle beam microscopes to probe a specimen, e.g. a scanning electron microscope (SEM), a transmission electron microscope (TEM), a scanning transmission microscope (STEM), or the like. Further, the charged particle beam device according to the invention may also be a device that uses the charged particle beam to structure a specimen. Non-limiting examples of charged particle beam devices that structure a specimen are, e.g. an electron beam pattern generators used to structure the surface of a specimen, like a lithographic mask, a focussing ion beam device (FIB) to slice or mill a specimen, and the like. Even though the term "charged particle beam" mainly refers to beams of electrons or beams of ions, the charged particle beam may also be of other charged elementary particles.

The charged particle beam source according to the invention may be any source that is capable of emitting electrons, ions or other elementary particles into vacuum. Preferably, the charged particle beam source is one of the known electron beam sources used for electron microscopes, e.g. a thermionic tungsten hairpin gun, or one of the many types of field emission electron guns known in the art. If the charged particle beam device is an ion beam device, the charged particle beam source is preferably a Ga-ion beam source, or a gas plasma source.

The term "focussing lens" according to the invention refers to any lens that is capable of providing a focussing electric or magnetic field for focussing the beam of charged particles like onto a specimen. The term "focussing lens" also includes lenses which combine electrical and magnetic fields for focussing the charged particle beam, see e.g. "*High Precision electron optical system for absolute and CD-measurements on large specimens*" by J. Frosien, S. Lanio, H. P. Feuerbaum, Nuclear Instruments and Methods in Physics Research A, 363 (1995) which herewith is included in the description.

The term "aperture system" of the present invention refers to a system comprising at least a first member and a second member that are capable of blocking a respective first portion and/or second portion of the charged particle beam. Preferably, the members have a respective first and/or second edge that are capable of defining a respective first and/or second boundary of the aperture through which the charged particle beam can pass. Preferably, the term "aperture" refers to the area lateral to the charged particle beam direction left for the charged particle beam to pass by the members of the aperture system. If the members fully encircle the optical beam axis, the aperture may also be considered as the area lateral to the charged particle beam direction that is limited by the edges of the members surrounding the beam optical axis.

Preferably, first and/or second members each comprise two facing surfaces which approach each other along at least one direction to form an edge. Preferably, first and/or second members have the shape of a blade of a knife. Preferably, first and/or second members are made of a conducting material like platinum or molybdenum in order to not charge up during blocking the first and/or second portion of the charged particle beam. Preferably, the first and/or second members are oriented in a way that the first and/or second edge face the charged particle beam like a knife blade intended to "cut through" the charged particle beam. Preferably, first and/or second edges are one-sided cut edges. In this case it is preferred that the cutting edge of the respective one-sided cut edge lies within the plane of the member surface facing the charged particle beam source. This way, the scattering of the charged particle beam at the edges of the members is minimized to provide sharp boundaries for the aperture. Further, preferably, first and/or second member is thick enough to absorb or back-scatter the incoming radiation of the charged particles.

Preferably, first and/or second portions of the charged particle beam refer to the portions of the beam which is blocked by the respective member. The expression "blocked portion" refers to those particles of the charged particle beam that hit a member to become either absorbed or back-scattered by the member. The expression "transmitted portion", in contrast, refers to those particles of the charged particle beam that are able to pass all members of the aperture system.

Preferably, the edges of the respective first and second members are oriented with respect to each other as if they were to cut laterally through the charged particle beam from opposite sides. This way, the edges of the first and second members can limit the lateral extension of the charged particle beam to define an aperture angle for the focussing lens. Preferably, the edges of the respective first and second members are positioned to "cut through" the charged particle beam at the same location.

Generally, it is preferred that the aperture system is designed to provide a high symmetry to make design, construction and operation of the charged particle beam device as easy as possible. It is therefore preferred that the shape of the first member is the same as the shape of the second member. Further, it is preferred that the first member can be moved into a position in which the first member and the second member are symmetrically aligned with respect to a rotation by 180 degrees around the optical axis of the charged particle beam device. It is further preferred that the first means for moving the first member and the second means for moving the second member are mechanically the same means.

Preferably, the first edge and/or the second edge of the respective first and/or second member is shaped to provide a respective first and/or second boundary which extends essentially linearly. This way, by moving the respective member in a direction in which the respective edge extends, a new section of the edge can become exposed to the charged particle beam without that the shape of the effective aperture is changed. This way it is possible that sections of an edge that have been deformed due to interaction of the charged particle beam with the edge, can be replaced during operation by unused sections of the same edge without affecting the geometry of the aperture. Accordingly, time consuming replacements of outworn members, which requires breaking and renewing the vacuum of the charged particle beam device, can be saved.

With members having a linearly extending edge, it is preferred that they are moved by means that are capable of moving the member independently in two different directions. Preferably, in this case, one direction would point towards the charged particle beam for defining the aperture angle of the charged particle beam and the other along the edge to "replace" the edge by replacing it with a new section of the edge, without changing the aperture geometry.

In another preferred embodiment of the invention, first and/or second edges are shaped to provide inwardly angled respective first and/or second boundaries. This way, it is possible to provide with only two members a first and second boundary which fully encircles the charged particle beam. Preferably, the angle of the angled edges is essentially 90 degrees in order to provide a rectangular, possibly squared aperture. In still another preferred embodiment of the invention, the first and/or second edges are shaped to provide a rounded, preferably a circular first and/or second boundary.

Preferably, first means and/or the second means for moving the respective first and/or second members are means that are capable of moving the respective member in steps having a step size smaller than 10 µm, preferably smaller than 1 µm. For some applications, it is preferred that the step size is even smaller than 0.1 µm. Preferably, first and/or second means each include a motor, preferably a step motor, or a piezo-drive in order to be able to move the respective member by such small step size. First and/or second means may also comprise encoding systems to improve precision and reproducibility for moving the respective members.

In another preferred embodiment of the invention, the aperture system includes more than two members. This way, it is possible for the respective edges of the members to provide a boundaries that define an aperture that filly encircles the charged particle beam even if the edges of the more than two members all extend linearly. For example, with a first, a second and a third member having respective first, second and third linear edges, it is possible to form a triangular shaped aperture. Further, with a first, a second, a third and a fourth member having respective first, second, third and fourth linear edges, it is possible to form a rectangular, or even squared, aperture. Further, with a first, a second, a third, a fourth and a fifth member having respective first, second, third, fourth and fifth linear edges, it is possible to form a pentagonal shaped aperture, and so on. The more members the aperture system has, the higher the degree of symmetry with respect to a rotation around the charged particle beam axis (optical axis) can be achieved.

It should be noted that a particularly preferred aperture system comprises eight members. With a first, a second, a third, a fourth, a fifth, a sixth, a seventh and an eighth member having respective first, second, third, fourth, fifth, sixth, seventh and eighth linear edges, it is possible to form an octagonal shaped aperture. Since the octagonal shape can be made to exhibit a higher degree of rotational symmetry with respect to the charged particle beam than a squared shaped aperture, an aperture system with eight members may significantly reduce the beam spot size, compared to the beam spot size shaped by, say, four members.

Again, when having more than four members, it is generally preferred that the aperture system is capable of providing a high symmetry with respect to the charged particle beam in order to make design, construction and operation of the charged particle beam device as easy as possible. It is therefore preferred that the shape of all members involved in the aperture system are the same. Further, it is preferred that all members involved in the aperture system can be moved into positions that provide the highest possible rotational symmetry for the aperture.

In the description of the preferred embodiments below, the reference numbers in the description refer to the enclosed figures FIG. 2, FIG. 3a-3d, 4a-4e, 5a-5b, and FIG. 6a-6b. However, the figures only represent particular, non-limiting embodiments of the invention which only have the purpose of being illustrative examples of the invention. The description below, even though it makes reference to the figures, is to be understood in a broad sense and includes any deviation from the described embodiments which is obvious to a person skilled in the art.

Figure 2:
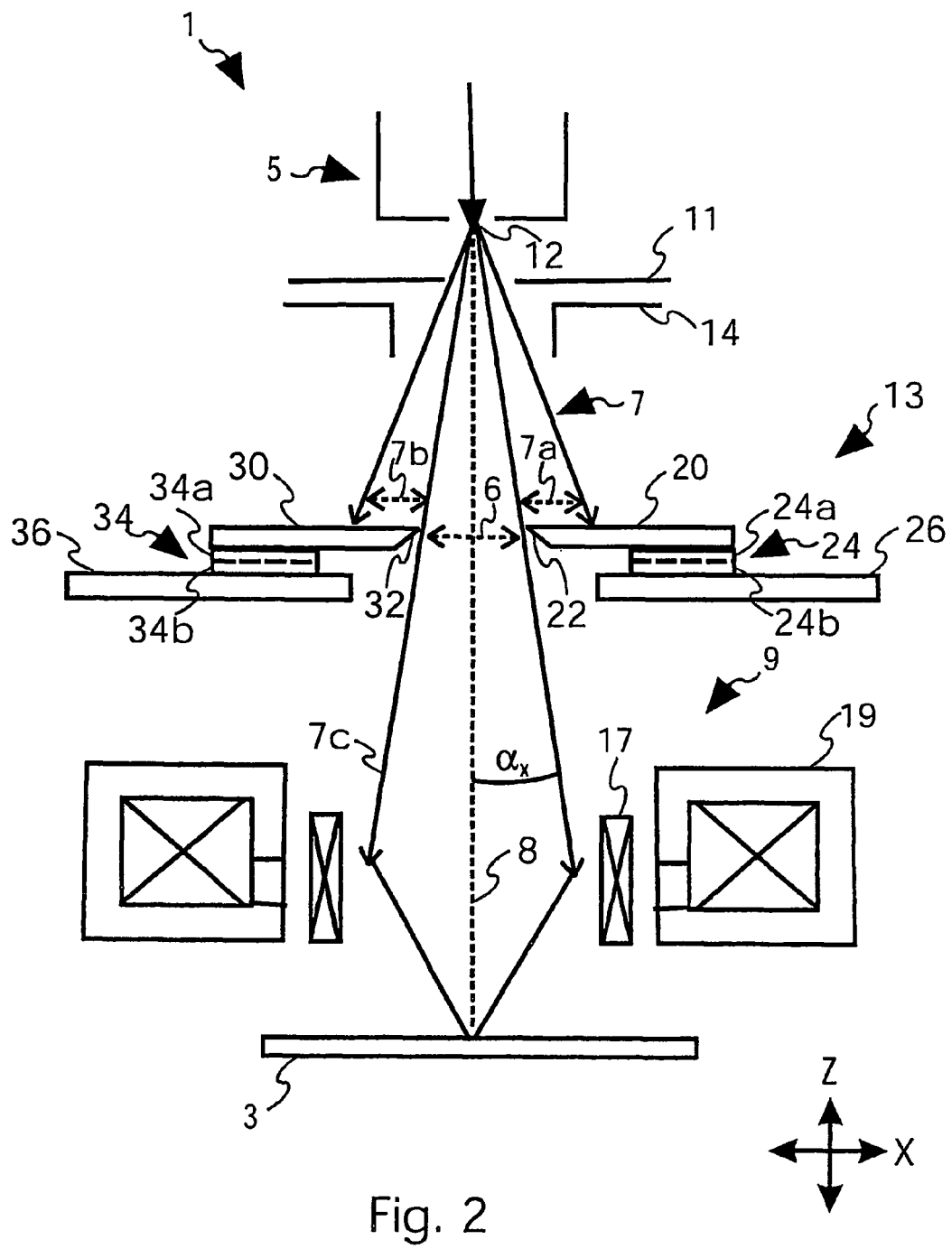
FIG. 2 First scanning electron microscope (SEM) with an aperture system according to the invention.

FIG. 2 schematically illustrates relevant elements of a charged particle beam device 1 according to the invention, which may be a scanning electron microscope (SEM) of a type as described, for example, in the publication by J. Frosien et al. in "*Nuclear Instruments and Methods in Physics Research*", A 363 (1995). In this case, the charged particle beam source 5 is a thermal field emission gun having a ZrO/W cathode in which the electron emission is initialized by an electric field between an emission tip 12 and extraction electrode 11. A further acceleration electrode 14 accelerates the emitted electrons to a desired intermediate beam energy of typically 5 to 20 keV. These energy values, however, may vary widely when other types of microscopes are used.

Aperture system 13 between the charged particle beam source 5 and the focussing lens 9 is shown to block first and second portions 7a, 7b of the electron beam 7 thereby defining the shape of the aperture 6 and, accordingly, the aperture angle $\alpha_x$ at which the electron beam 7 arrives at the focussing lens 9.

The focussing lens 9 may be any of the known electrostatic lenses, magnetic lenses or, as in FIG. 2, combined electrostatic magnetic lenses which are described in more detail in the mentioned publication by J. Frosien. The combined electrostatic magnetic lens of FIG. 2 includes a magnetic lens 19 where the yoke is also used as an electrode to provide an electric field. For more completeness, FIG. 2 also depicts a scanning system 17 to scan the charged particle beam 7 across the surface of the specimen 3.

FIG. 2 schematically illustrates the relevant elements of the aperture system 13. The aperture system 13 includes two members, i.e. first member 20 having a first edge 22 and second member 30 having a second edge 32, to define the size of the aperture 6 and the aperture angle $\alpha_x$ within the plane defined by the optical axis 8 and the X-direction. The two edges 22, 32 correspond to the sharp side of the respective member 20, 30 which in general has a knife-like shape. This is to minimize scattering of electrons of the electron beam 7 grazing along any of the edges 22, 32. Preferably, the two members are positioned to "cut" into the charged particle beam 7 at the same height (i.e. Z-direction) to provide that the edges 22, 32 block the respective first and second portions 7a, 7b of the electron beam 7 at the same location.

First and second member 20, 30 are each mounted to respective first and second means 24, 34 for moving the members, which in turn are fastened to respective stages 26, 36 that are part of the charged particle beam device structure. With first and second means 24, 34, the respective members 20, 30 can be moved with respect to the first and second stages 26, 36. For moving, first and second means 24, 34 each comprise two piezo-drives 24a, 24b, 34a, 34b. Like for a X-Y cross table, piezo-drives 24a, 34a serve to move the respective members 20, 30 in X-direction for moving the respective edges 22, 32 in or out of the electron beam 7, while piezo-drives 24b, 34b serve to move the respective members 20, 30 in a Y-direction to move the respective edges 22, 32 in a direction along the direction of the respective edge (see also FIG. 3a). This way, piezo-drives 24a, 34a can be used to adjust the aperture angle $\alpha_x$ to a desired angle, while piezo-drives 24b, 34b can independently be used to "clean" the edges 22, 32 by moving one section of a given edge 22, 32 out of the electron beam 7 out and another section in. Note that the "cleaning" -procedure can be carried out without changing the aperture. The piezo-drives 24a, 34a, 24b, 34b in FIG. 2 are capable of moving the members with step sizes smaller than 10 µm. Generally, the use of piezodrives for X-Y cross tables is well known in the art and does not require further explanation.

It should be noted that the present invention is independent of the means by which the members are moved. Therefore, besides using piezo-drives as means for moving a member, the members can be moved, e.g., by stepping motors, by thermal expanding materials or memory metals that can move a member, or by any other means that are capable of moving a member within the micrometer scale. Also, the means for moving a member may include an encoder to improve precision and reproducibility for the positioning of the respective members.

Figure 3A:
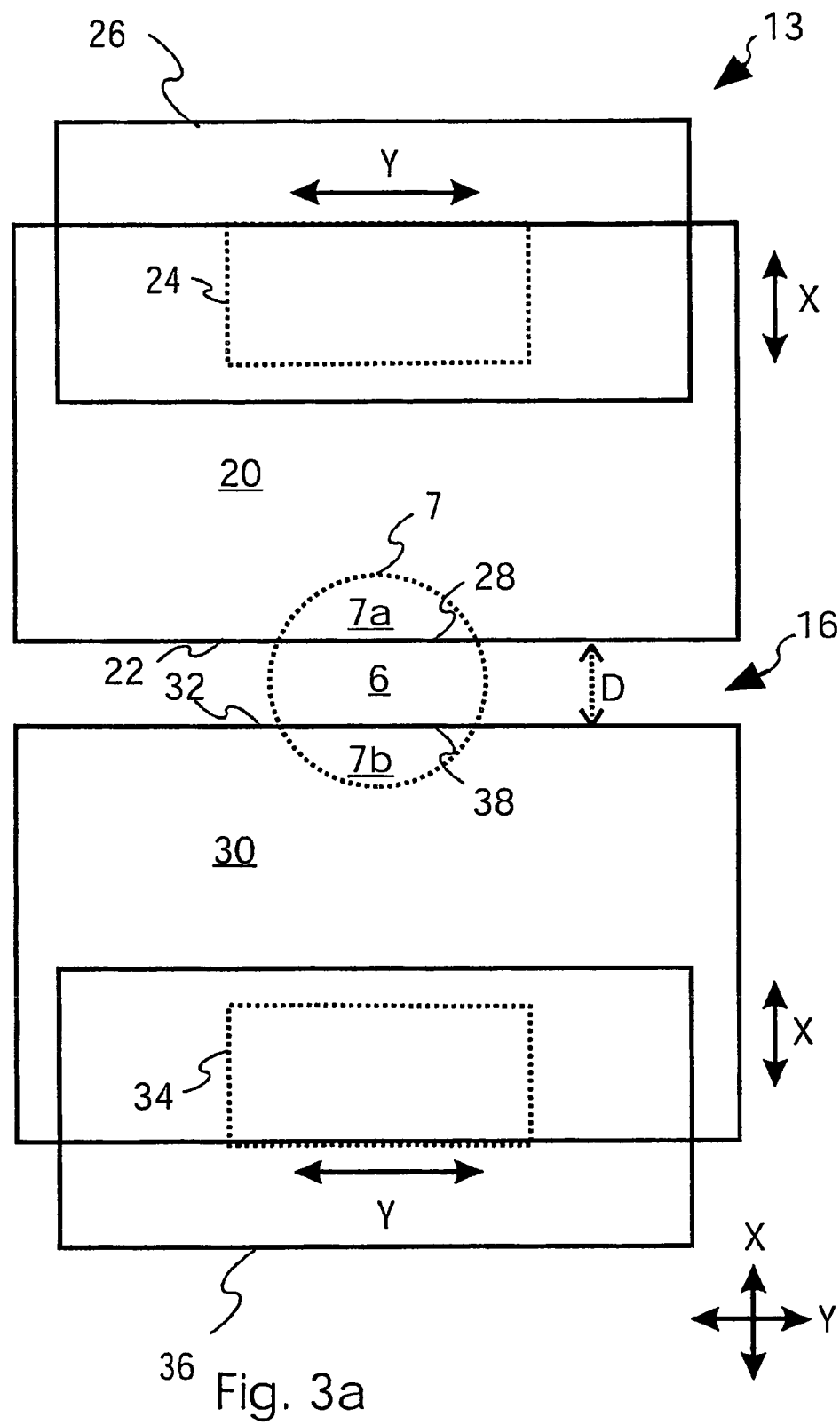
FIG. 3a A first aperture system according to the invention with first and second members having linear edges.

FIG. 3a illustrates the aperture system 13 of FIG. 2 as seen in the direction of the electron beam 7, whose cross section at the aperture system 13 is indicated by the dotted circle. Typically, the diameters of electron beams in an SEM of the type shown in FIG. 2 at the position of the aperture are in the range of 1 µm to 500 µm and preferably in the range between 5 and 200 µm.

First and second members 20, 30 of FIG. 3a are equally shaped and have each linearly extending edges 22, 32 that run in parallel thereby defining a slit 16 of width D. At the same time, the two edges 22, 32 define a first boundary 28 and a second boundary 38 that define the shape of aperture 6. Aperture 6 of FIG. 3a is characterized by the width D of the slit 16 which in turn defines an aperture angle $\alpha_x$ in X-direction. The aperture angle $\alpha_y$ in Y-direction, in contrast, is only limited by the diameter of the electron beam 7.

The sizes of the members 20, 30 are limited by the available space within the vacuum chamber of the respective charged particle beam device. On the other hand, the size of the members must be large enough to be able to block the relevant portions 7a, 7b of the electron beam 7. Further, it is advantageous to have the linearly extending first and second edges 22, 32 at least a few times longer than the cross section of the electron beam 7 in order to be able to "clean" the edges by replacing a worn out section of the edge by a new section that has not been exposed to the electron beam 7. Therefore, for a electron beam device as shown in FIG. 2, the sizes of the members 20, 30 in X- and Y-directions are typically in the range of a few millimeters.

FIG. 3a further illustrates schematically, as dotted lines, first and second means 24, 34 sandwiched between the respective first and second stages 26, 36 and the respective first and second members 20, 30. As already explained in the description of FIG. 2, first and second means 24, 34 each comprise piezo-drives 24a, 34a for driving the respective members 20, 30 in X-direction, and piezo-drives 24b, 34b for driving the respective members 20, 30 in Y-direction, as indicated by the four double arrows in the FIG. 3a.

Figure 3B:
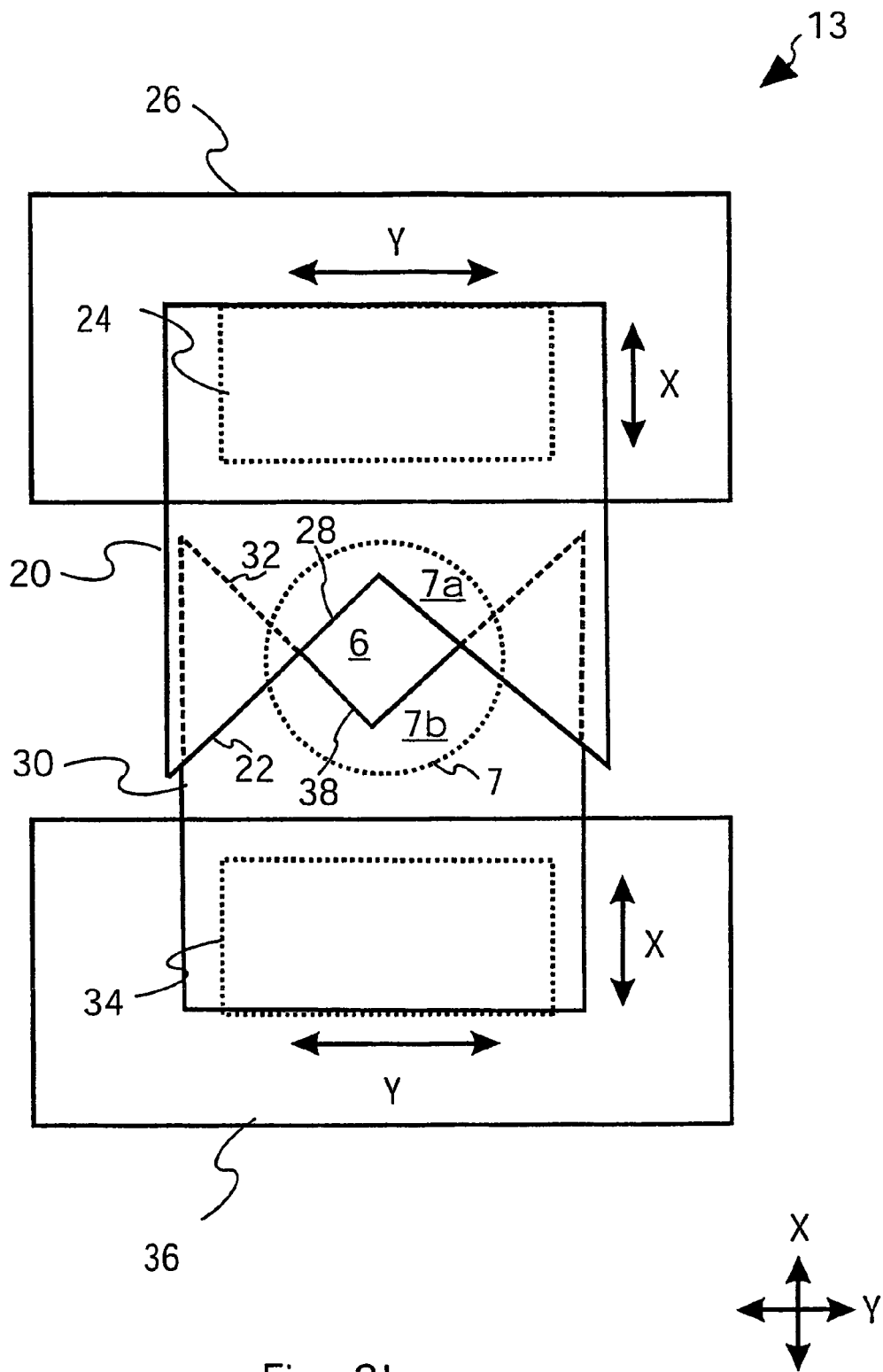
FIG. 3b A second aperture system according to the invention with first and second members having each angled edges.

FIG. 3b illustrates a second aperture system 13 according to the invention that, for example in the SEM of FIG. 2, can serve as a replacement for the aperture system 13 of FIG. 3a. The aperture system of FIG. 3b is the same as the one of FIG. 3a with the differences that the first and second edges 22, 32 are inwardly angled in order to provide for an aperture 6 that fully encircles the transmitted portion of the electron beam 7. The respective angles of the angled edges 22, 32 in FIG. 3b are both essentially 90 degrees in order to have a rectangular shaped or, preferably, a square shaped aperture 6. With the rectangular edged members 20, 30, it is possible to fully control the aperture angles of the charged particle beam device in any direction within the X-Y-plane with only two members 20, 30. For example, by moving first and second members 20, 30 apart from each other along the X-direction, the aperture 6 can be gradually increased while maintaining the proportions of the two sides of the aperture 6. However, with the design of FIG. 3b, it is not possible to "clean" any of the edges 22, 32 by simply moving the members 20, 30 in a direction, as it was possible with the linearly edged aperture system 13 of FIG. 3a.

Figure 3C:
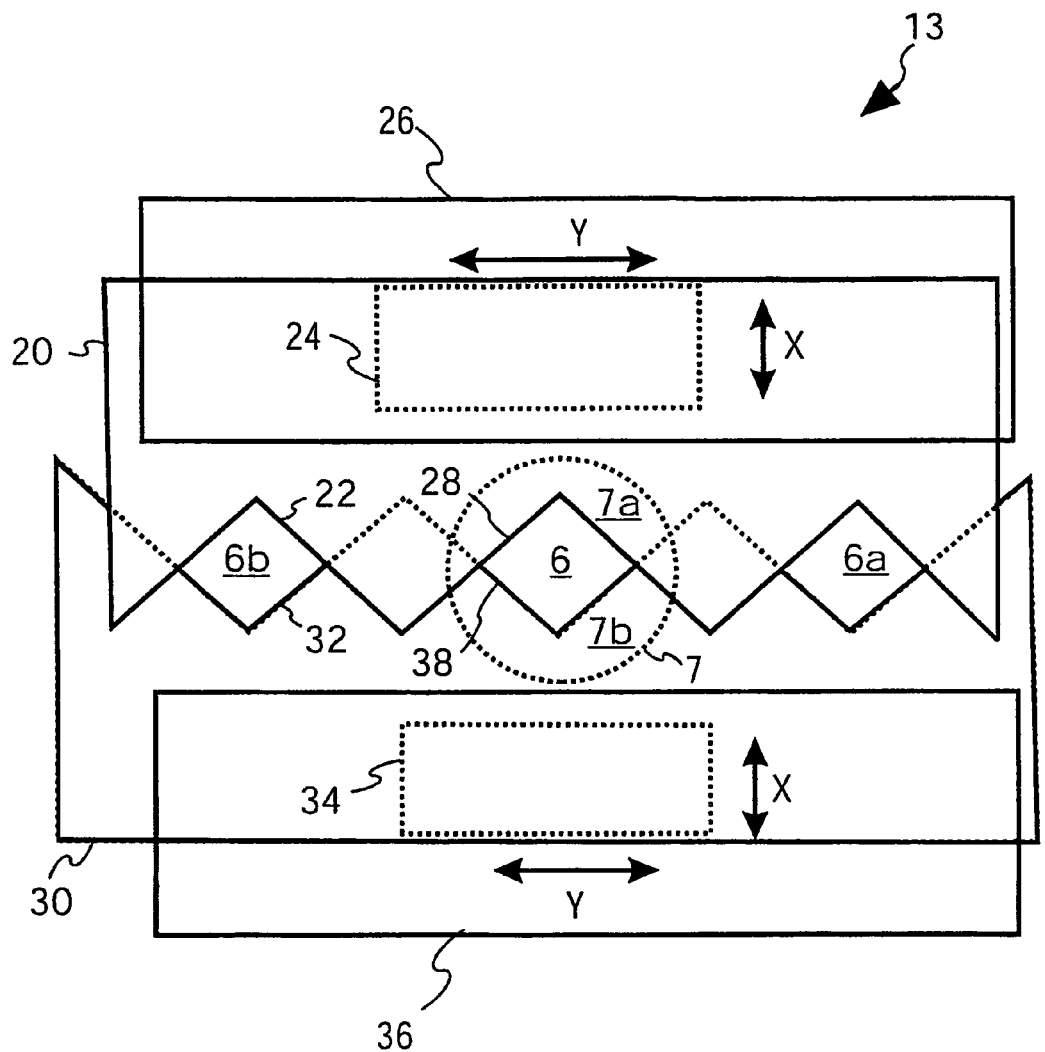
FIG. 3c A third aperture system according to the invention with first and second members having each multiple angled edges (saw tooth design).
Figure 3C:
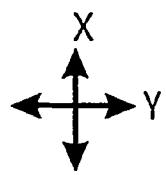

The disadvantage of not being able to "clean" the edges 22, 32 of the members 20, 30 of FIG. 3b within the vacuum can be remedied by the "saw tooth" design of the two members 20, 30 shown in FIG. 3c. The two members 20, 30 of FIG. 3c exhibit each multiple inwardly angled edges 22, 32 which together resemble a line of teeth of a saw. The two members 20 30 with the saw tooth sides facing each other can be positioned with respect to each other to provide multiple apertures 6, 6a, 6b. For example, the "active" aperture defining the aperture angle of the charged particle beam 7 in FIG. 3c is aperture 6. However, once the first and second edges 22, 32 at the regions of the respective boundaries 28, 38 are worn out due to irradiation by the charged particle beam 7, the active aperture 6 can be replaced by one of the other apertures 6a or 6b by moving the first and second members 20, 30 in into the same Y-direction. The moving of the two members, again, can be carried out by means of the first and second means 24, 34 for moving the respective first and second members 20, 30, e.g. a piezo-drive, without having to break the vacuum.

Figure 3D:
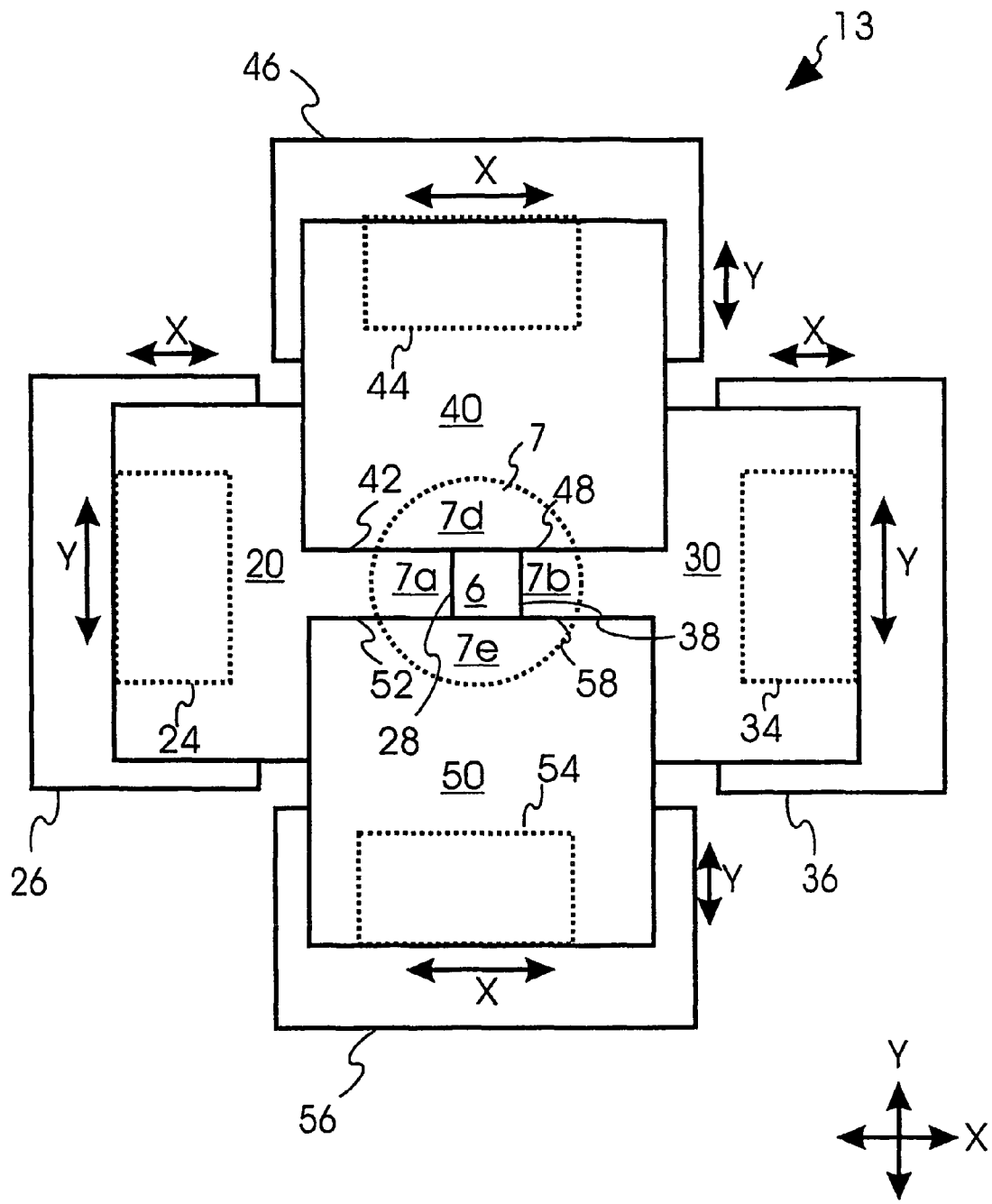
FIG. 3d A fourth aperture system according to the invention having four members each having linear edges.

FIG. 3d illustrates a fourth aperture system 13 according to the invention that, for example in the SEM of FIG. 2, can serve as a replacement for one of the aperture systems 13 of FIGS. 3a-3cb. Aperture system 13 of FIG. 3d comprises four members, i.e. first member 20, second member 30, third member 40 and fourth member 50, in order to provide four boundaries 28, 38, 48 and 58 that can be positioned to fully encircle the electron beam 7. In addition, maximum rotational symmetry of the transmitted portion 6 with respect to the electron beam 7 is achieved by having the first and second edges 22, 32 aligned in parallel, the third and fourth edges 42, 52 aligned in parallel and by having the first or second edge 22, 32 orthogonally aligned with respect to the third and fourth edges 42, 52 (see also FIG. 4b). This way, with the help of means 24, 34, 44, 54 for moving first, second, third or fourth members 20, 30, 40, 50, the members can be moved to positions that provide a square shaped aperture 6 aligned to the electron beam.

Again, for the sake of simplicity in manufacturing and operation of a charged particle beam device 1 according to the invention, it is preferred for the aperture system 13 of FIG. 3*d* that the first member 20, first means 24 for moving the member and first stage 26 are essentially the same units as the corresponding second, third and fourth member 30, 40, 50, the corresponding second, third and fourth means 34, 44, 54 for moving the respective member, and the corresponding second, third and fourth stage 36,46, 56.

Further, for symmetry reasons, it is preferred that the aperture system 13 of FIG. 3*e* can be considered as being assembled by two aperture systems of the type shown in FIG. 3*a*, with are positioned on top of each other and rotated by 90 degrees with respect to each other within the X-Y-plane. In this case, the first aperture system with first and second members 20, 30 blocks first and second portions 7*a*, 7*b* of the electron beam 7, while the second aperture system with third and fourth members 40, 50 blocks third and fourth portions 7*d*, 7*e*.

In order to illustrate the advantages of the aperture systems according to the invention, FIGS. 4*a*-4*e* use the aperture system 13 as described in FIG. 3*d* to demonstrate several operational modes.

Figure 4A:
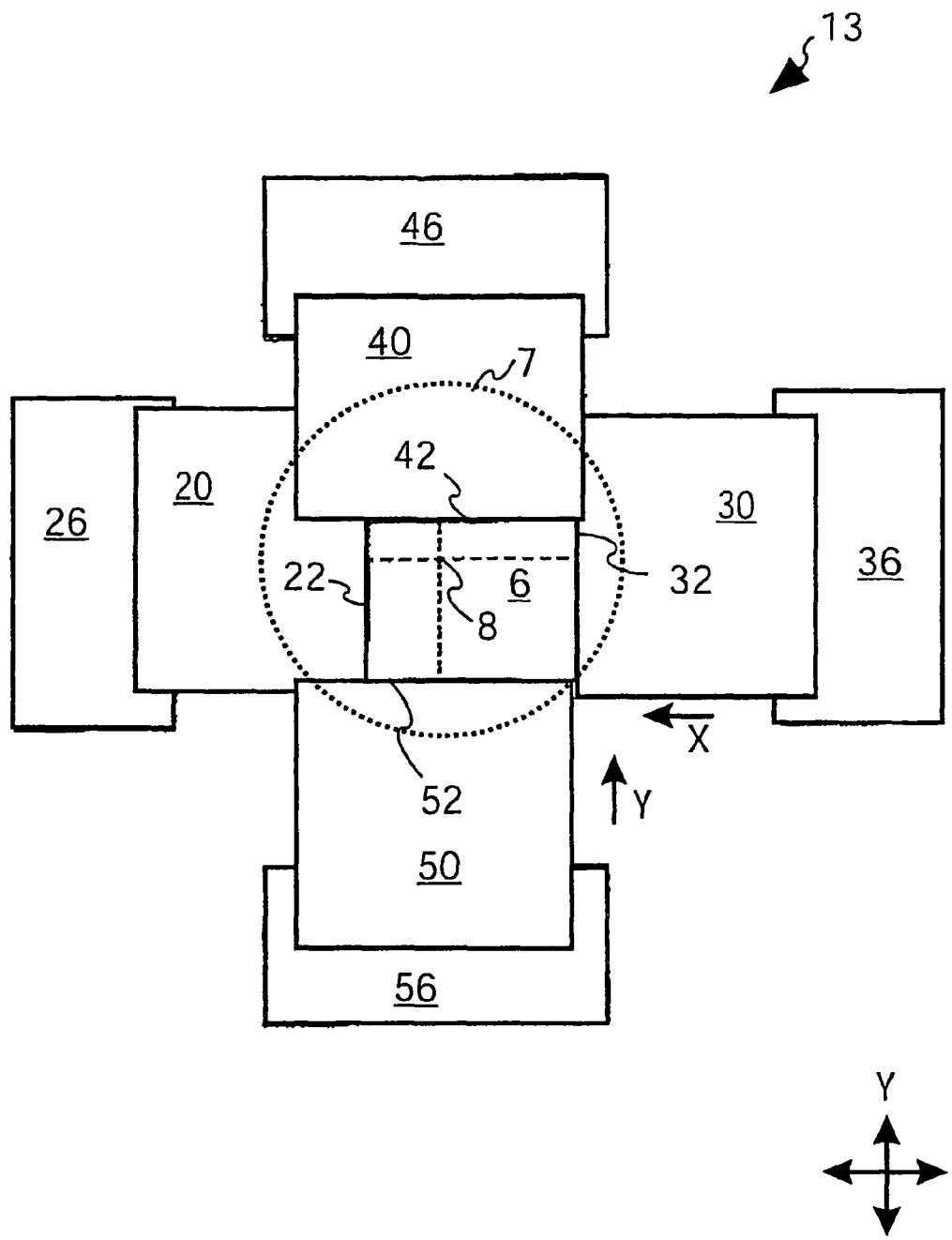
FIG. 4a Fourth aperture system with the aperture misaligned with respect the optical axis.

FIG. 4*a* deals with the situation where the first, second, third and fourth edges 22, 32, 42, 52 are not centered with respect to the optical axis 8 of the charged particle beam device. In this case, aperture 6 is not aligned with respect to the optical axis 8. This often implies that the charged particle beam 7 becomes deformed due to aberrations when passing through the focussing lens 9. Such deformation in turn usually reduces the spatial resolution and beam current for probing or structuring a specimen.

Figure 4B:
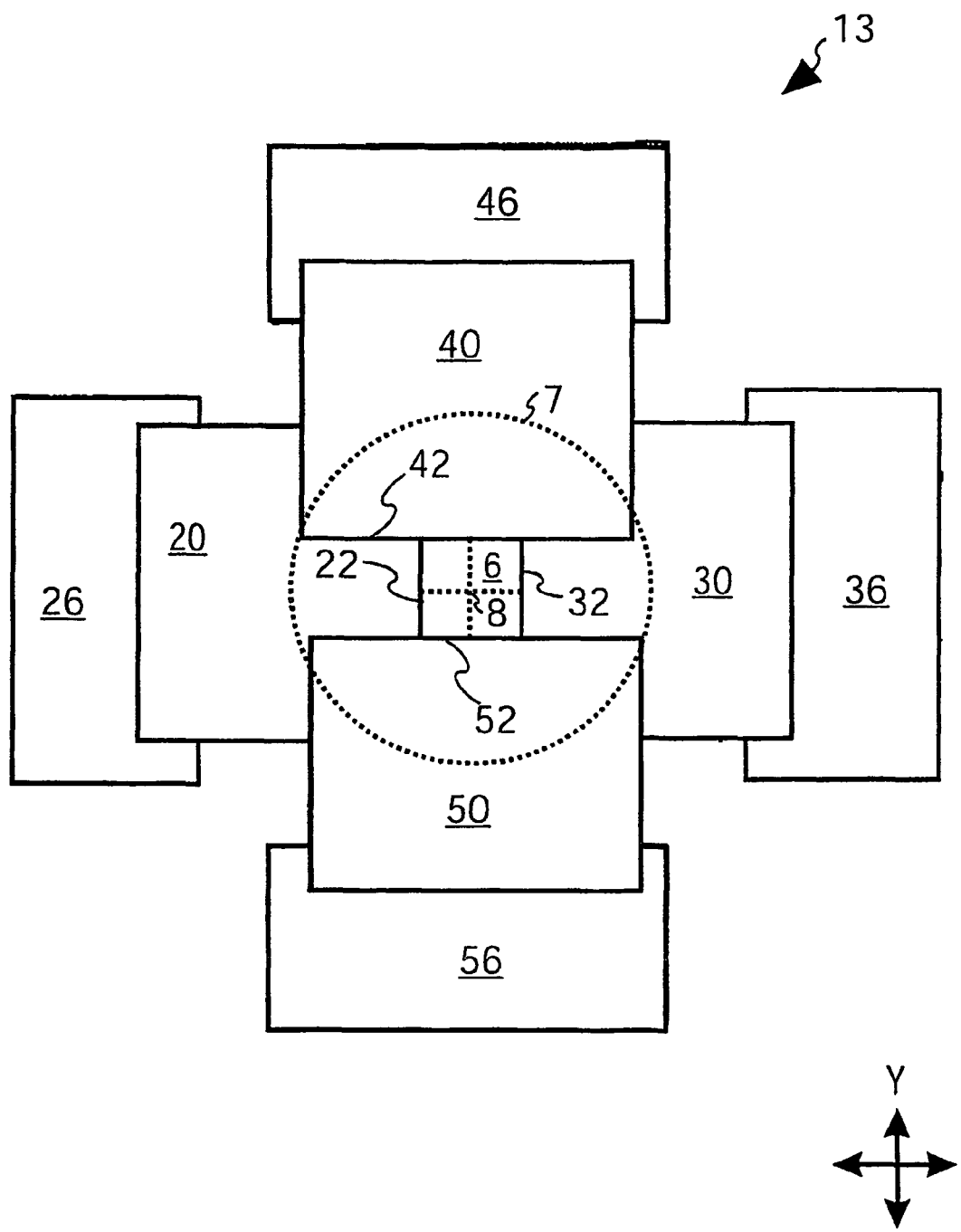
FIG. 4b Fourth aperture system with the aperture aligned with respect the optical axis.

However, due to the ability of the aperture system 13 to move the members 20, 30, 40 and 50 gradually and independently of each other, the alignment of the first, second, third and fourth edges 22, 32, 42, 52 with respect to the optical axis 8 can be recovered, e.g. by moving second member 30 to the left within the X-direction, and by moving the fourth member 50 upwards within the Y-direction. After such operations, the transmitted portion 6 is aligned with respect to the optical axis, as shown in FIG. 4*b*.

Figure 4C:
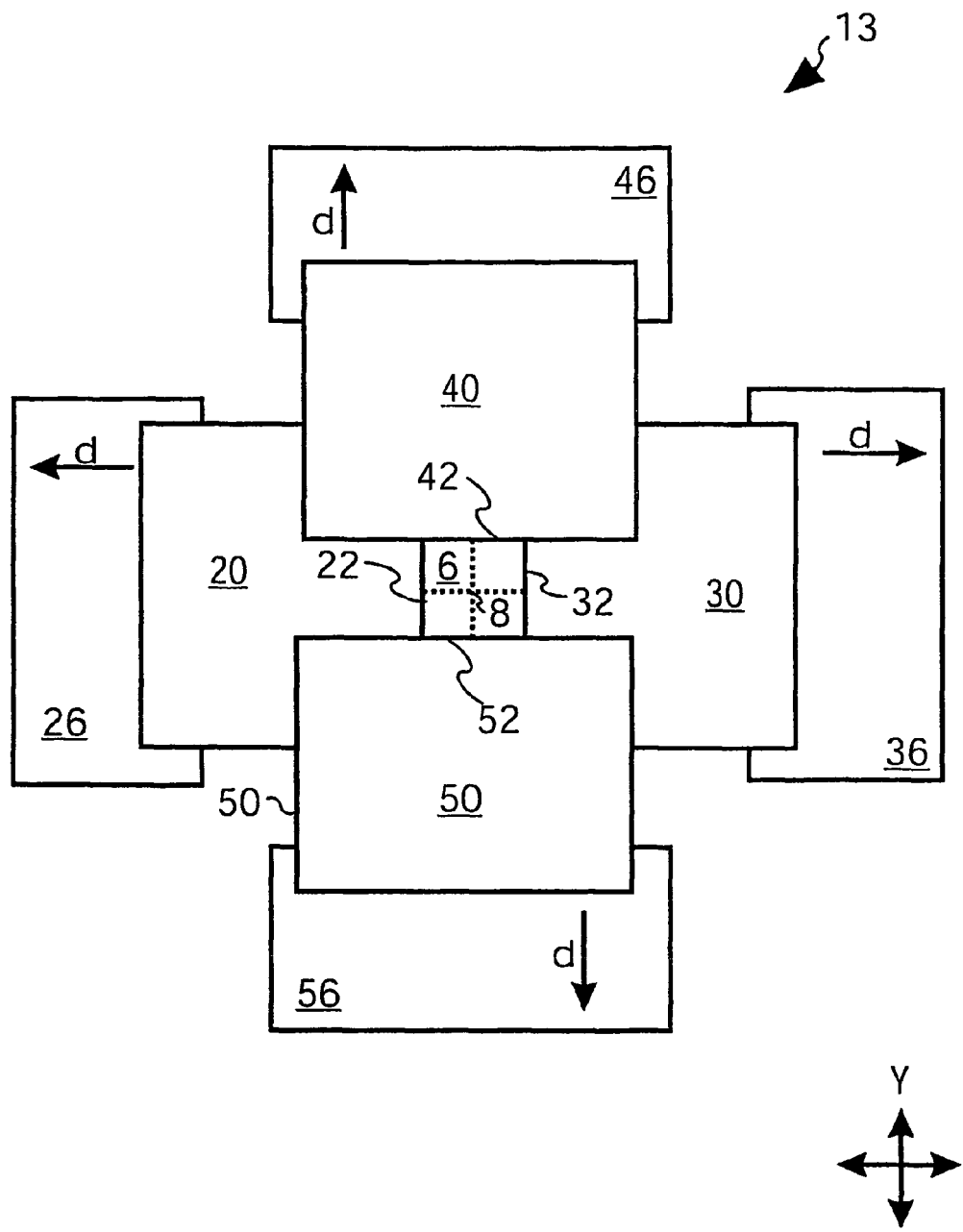
FIG. 4c Fourth aperture system with the members moving to increase the aperture while staying aligened with respect to the optical axis.

FIG. 4*c* illustrates, with four arrows, movements of the first, second, third and fourth members 20, 30 40 50 in order to increase the aperture 6 in X- and in Y-directions without affecting its alignment to the optical axis 8. Starting out from a situation as shown in FIG. 4*b*, first member 20 is moved along the X-direction to the left by a distance d, second member 30 is moved along the X-direction to the right by the same distance d, third member 40 is moved along the Y-direction upwards by the same distance d, and fourth member 50 is moved along the Y-direction downwards by the same distance d.

Figure 4D:
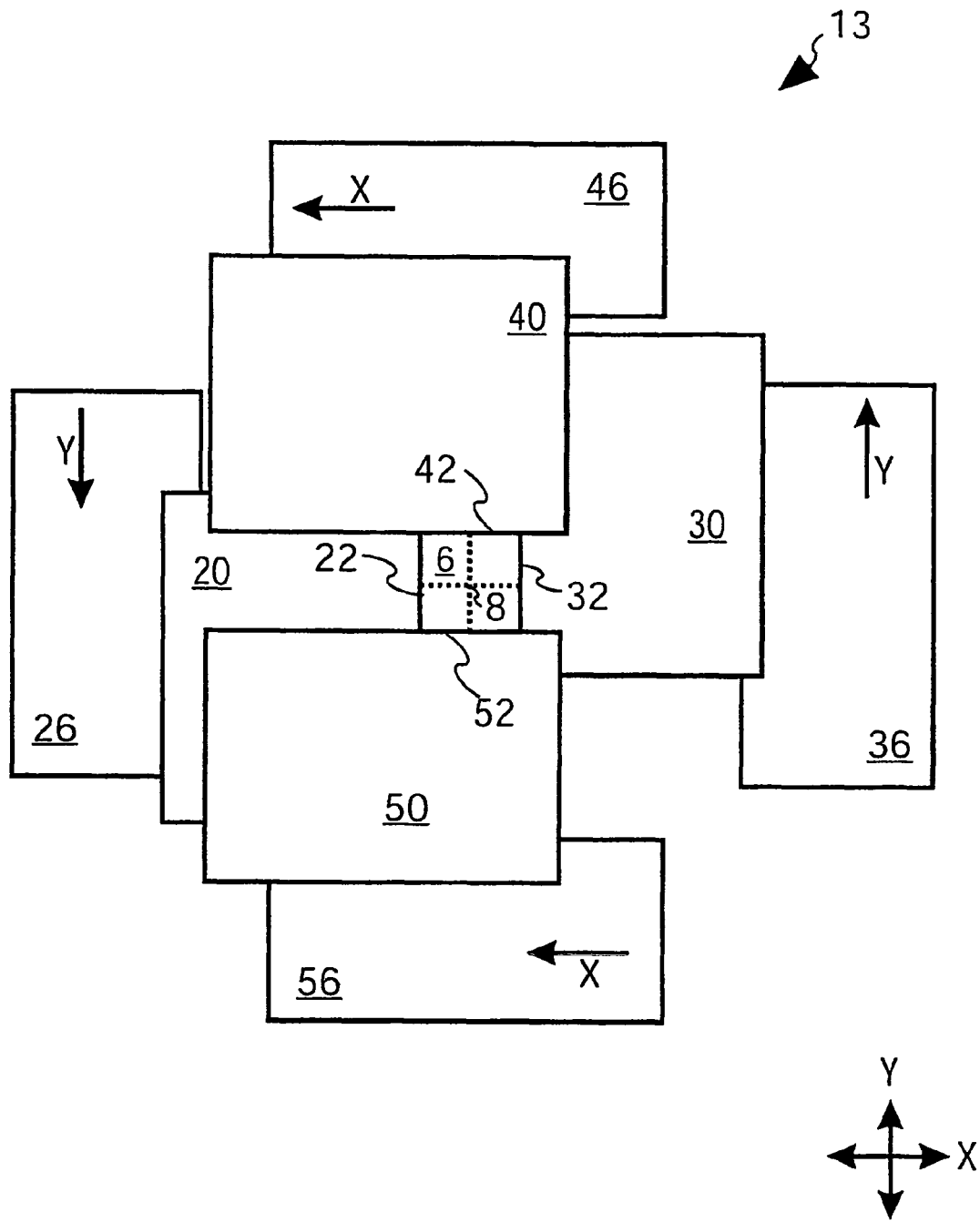
FIG. 4d Fourth aperture system with the members moving to provide clean edges while leaving the aperture unchanged.

FIG. 4*d* illustrates, by means of arrows, movements of the first, second, third and fourth members 20, 30, 40, 50 in order to "clean" aperture 6. "Cleaning" is carried out by replacing deformed or contaminated sections of respective first, second, third and fourth edges 22, 32, 42, 52 by sections of the same edge which have not been exposed to the charged particle beam 7 before. Deformation or contamination of a section of an edge is usually caused by the intense exposure to the charged particle beam 7 during the blocking of portions 7*a*, 7*b*, 7*d*, 7*e* of the charged particle beam to define the shape of the aperture 6. The replacement of deformed or contaminated sections of an edge by sections which have not been exposed to the charged particle beam in the way as described in FIG. 4*d* makes it possible to maintain a precise definition of the aperture 6 and the corresponding aperture angles over long periods of time.

In the design of FIG. 4*d*, the replacement of the deformed or contaminated sections is carried out by moving the respective members 20, 30, 40, 50 in a direction parallel to the respective edge 22, 32, 42, 52. For example, in FIG. 4*d*, the first member 20 is moved downwards along the Y-direction for at least the distance corresponding to the diameter of the electron beam 7, the second member 30 is moved upwards along the Y-direction for at least the distance corresponding to the diameter of the electron beam 7, and the third and fourth members 40, 50 are moved to the left along the X-direction for at least the distance corresponding to the diameter of the electron beam 7. This way, the deformed or contaminated sections of all for members 20, 30, 40, 50 have been replaced by new edge sections without having changed the position or size of the aperture 6. Since the replacements of deformed or contaminated sections of edges by new edges can be carried out without braking the vacuum of the charged particle beam device, or even during beam operation, the working efficiency of charged particle beam devices can be significantly improved.

Figure 4E:
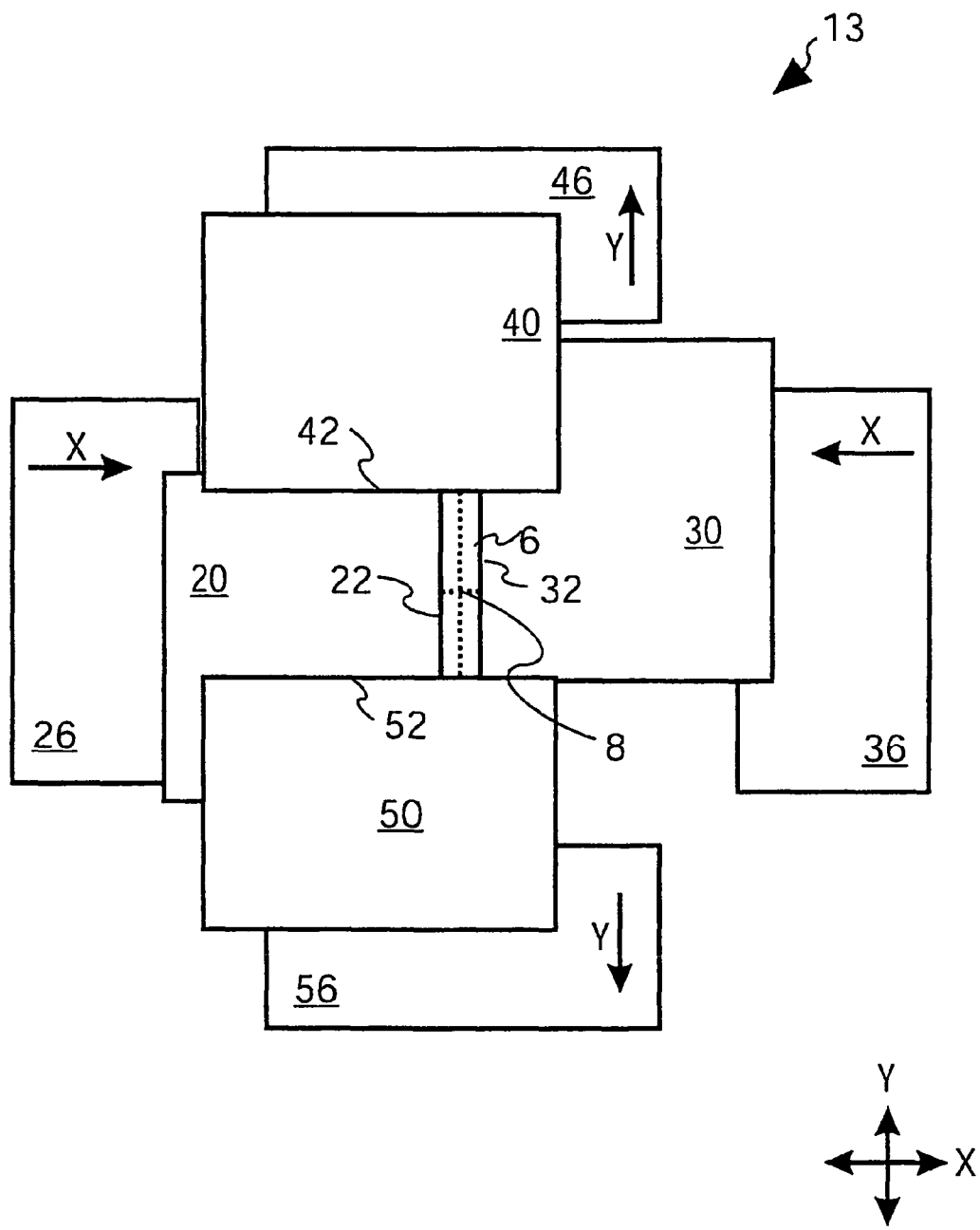
FIG. 4e Fourth aperture system with the members moving to provide a rectangular shape with different distances in X- and Y-direction FIG. 5a A fifth aperture system according to the invention having eight members each having linear edges.

FIG. 4*e* illustrates the situation where the first and second members 20, 30 have been moved towards each other along the X-direction in order to provide a small aperture angle ax within the X-direction, and where the third and fourth members 40, 50 have been moved in opposite directions along the Y-direction in order to make the aperture angle $\alpha_y$ within the Y-direction large. This way, the electron beam 7 receives a rectangular shaped cross section after it has passed through the aperture 6 defined by the first, second, third and fourth edges 22, 32, 42, 52. Such shape can be useful for beam operations where a high spatial resolution is required only in one direction, like for ion beam (FIB) devices used to mill slices out of a specimen. For such operation, it is even conceivable to place the four stages 26, 36, 46, 56 onto a rotational table in order to freely rotate the aperture for efficiently milling the specimen along any desired direction.

Figure 5A:
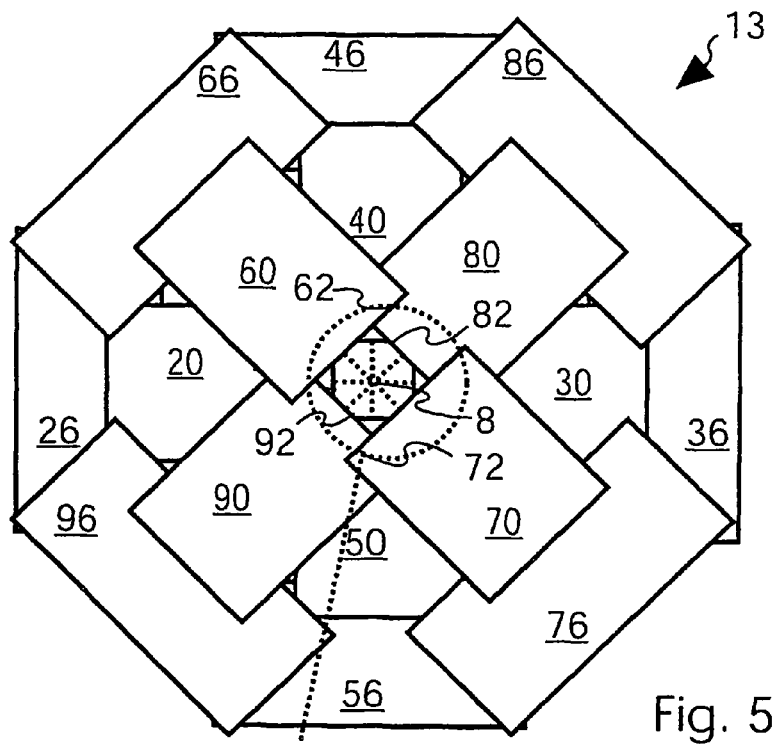
Figure 5B:
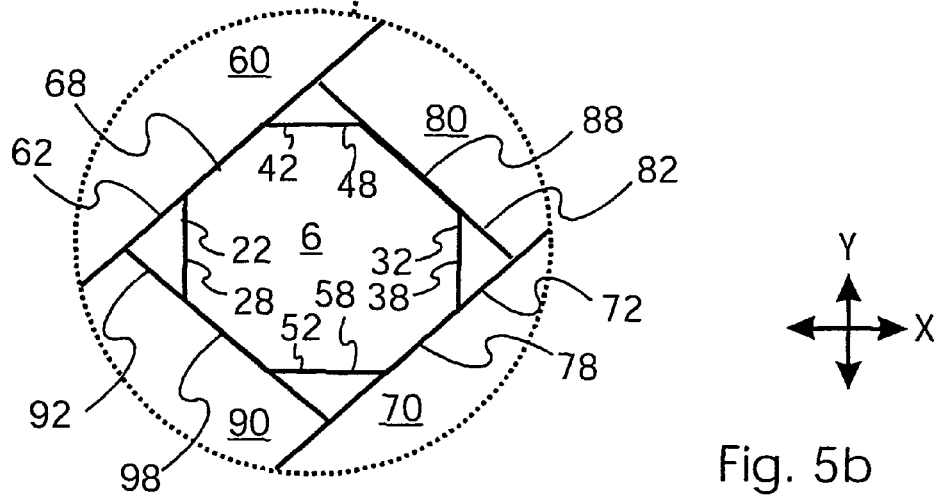

FIGS. 5*a* and 5*b* illustrate a fourth aperture system 13 according to the invention using eight members, i.e. the first member 20, second member 30, third member 40, fourth member 50, fifth member 60, sixth member 70, seventh member 80 and eighth member 90, to define an octagonal shaped aperture 6. With eight members 20, 30, 40, 50, 60, 70, 80, 90, it is possible to "cut away" the four corners of a rectangular shaped aperture 6 that an aperture system with only four members would produce. With the corners "cut off", the rotational symmetry of the aperture 6 further improves to minimize the beam spot size.

The aperture system 13 of FIG. 5*a* essentially consists of two aperture systems of the type shown in FIG. 3*d* which are position on top of each other and rotated by 45 degrees with respect to each other within the X-Y-plane. In this case, the first aperture system comprises the first, second, third and fourth members 20, 30, 40, 50, while the second system comprises the fifth, sixth, seventh and eighth members 60, 70, 80, 90. Each of the first, second, third, fourth, fifth, sixth, seventh and eighth members 20, 30, 40, 50, 60, 70, 80, 90 has respective linear first, second, third, fourth, fifth, sixth, seventh and eighth edges 22, 32, 42, 52, 62, 72, 82, 92 of the type as described for FIG. 3*d*. Further, first, second, third, fourth, fifth, sixth, seventh and eighth members 20, 30, 40, 50, 60, 70, 80, 90 are each mounted to respective independent means for moving the respective members (not shown in FIG. 5*a*) with respect to the first, second, third, fourth, fifth, sixth, seventh and eighth stages 26, 36, 46, 56, 66, 76, 86, 96.

FIG. 5*b* represents a blow-up view of the aperture region of the aperture system of FIG. 5*a* where the charged particle beam (not shown in FIG. 5*a, b*) is to arrive at the aperture system. FIG. The shape of the aperture 6 is defined by the first, second, third, fourth, fifth, sixth, seventh and eighth boundaries 28, 38, 48, 58, 68, 78, 88, 98 defined by the first, second, third, fourth, fifth, sixth, seventh and eighth edges 22, 32, 42, 52, 62, 72, 82, 92 which also define the portions of the charged particle beam 7 that are blocked by the first, second, third, fourth, fifth, sixth, seventh and eighth members 20, 30, 40, 50, 60, 70, 80, 90.

Figure 6A:
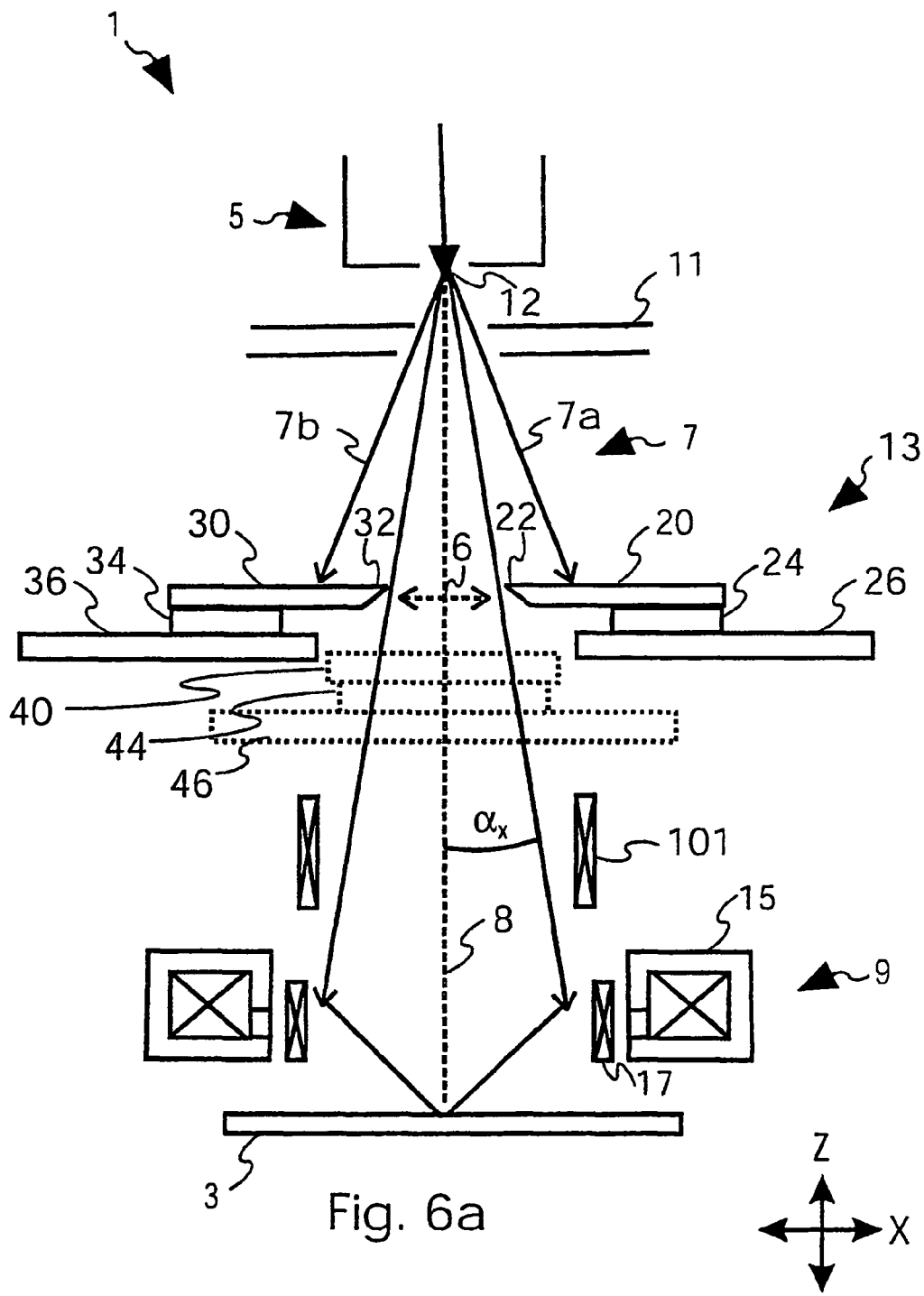
FIG. 6a Second scanning electron microscope (SEM) with an aperture system and a magnetic octupole according to the invention.

FIGS. 6a illustrates a second charged particle beam device 1 according to the invention which equals the SEM of FIG. 2 in many ways. However, different from the SEM of FIG. 2, the charged particle beam device 1 of FIG. 6a has an aperture system 13 with four members 20, 30, 40, 50 like the one described in FIG. 3d. With the aperture system 13 of FIG. 3d, the charged particle beam device 1 is capable of producing an electron beam with a square-shaped cross section that results in a square shaped beam spot 120.

In addition to the aperture system 13 of FIG. 3d, the charged particle beam device 1 of FIG. 6a also includes a magnetic octupole 101 positioned into the charged particle beam 7. As it turns out, the magnetic octupole field of the magnetic octupole 13 can be used to deflect the electrons of the charged particle beam 7 in a way that leads to a rounding of the four corners of the square shaped beam spot 120, which in turn reduces the size of the beam spot.

The magnetic octupole 101, in principle, may be positioned anywhere within the charged particle beam 7 to provide for a reduction of the beam spot size. However, it is generally preferred that the magnetic octupole is positioned in regions of the charged particle beam 7 where the beam has a large cross section. Therefore, it is preferred that the magnetic octupole 101 is positioned in the region between the aperture system 13 and specimen 3 or, even better, nearby or within the focussing lens 9.

Figure 6B:
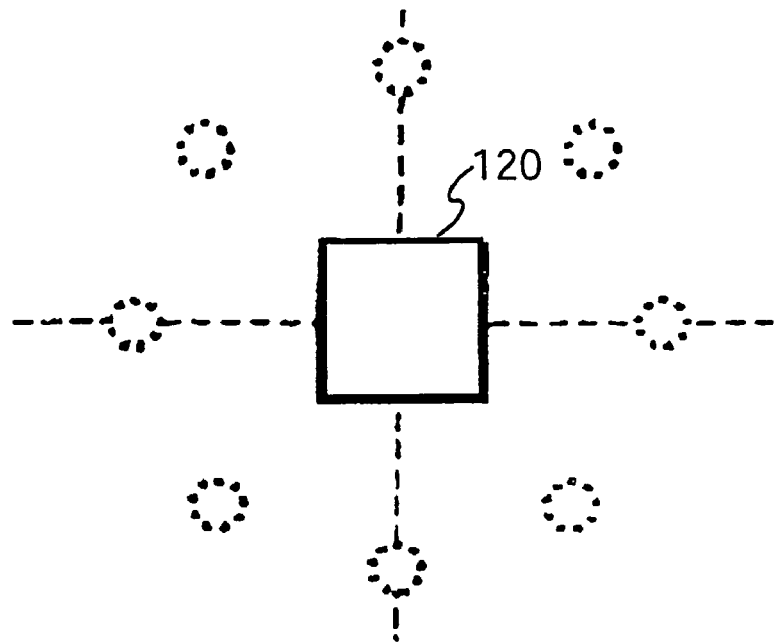
FIG. 6b Beam spot of the SEM of FIG. 6a with the magnetic octupole switched off.
Figure 6C:
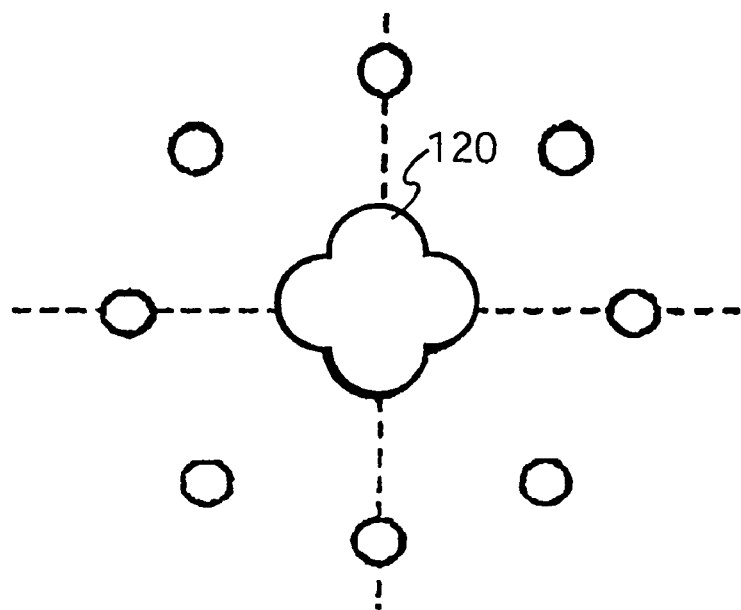

FIGS. 6b and 6c illustrate the effect of using a magnetic octupole for rounding the corners of a squared shaped beam spot 120. In FIG. 6b, the magnetic octupole field is switched off. Accordingly, the beam spot 120 of the electron beam 7 after it has passed through the square-shaped aperture 13 and focussing lens 9, is square-shaped. The maximum extension of the square-shaped beam spot 120, therefore, is given by the diagonal of the square.

FIG. 6c depicts the beam spot 120 of the electron beam 7 under the same conditions as in FIG. 6b, but with a magnetic octupole field switched on. The magnetic octupole field has the effect that charged particles in the corners of the charged particle beam 7 become deflected towards the optical axis with the effect that the corners of the beam spot 120 disappear. In this case, the maximum extension of the rounded beam spot 120 is essentially given by the length of a side of the original square, which is smaller than the diagonal of the square. As a consequence, the charged particle beam 7 corrected by the magnetic octupole 101 in FIG. 6a can generate a smaller beam spot with a higher current density.

The method of reducing the spot size of a square-shaped charged particle beam 7 by a magnetic or electric octupole has the advantage over the aperture system 13 with octagonal aperture (see FIG. 5b) in that many charged particle beam devices are equipped with a magnetic or electric octupole anyway in order to correct beam astigmatism. Therefore, instead of installing another four movably connected members of the type as shown in FIG. 5b into a charged particle beam device, it is simpler to use the octupole field of a stigmator for correcting the square-shaped beam spot 120 to a rounded beam spot.

Figure 7A:
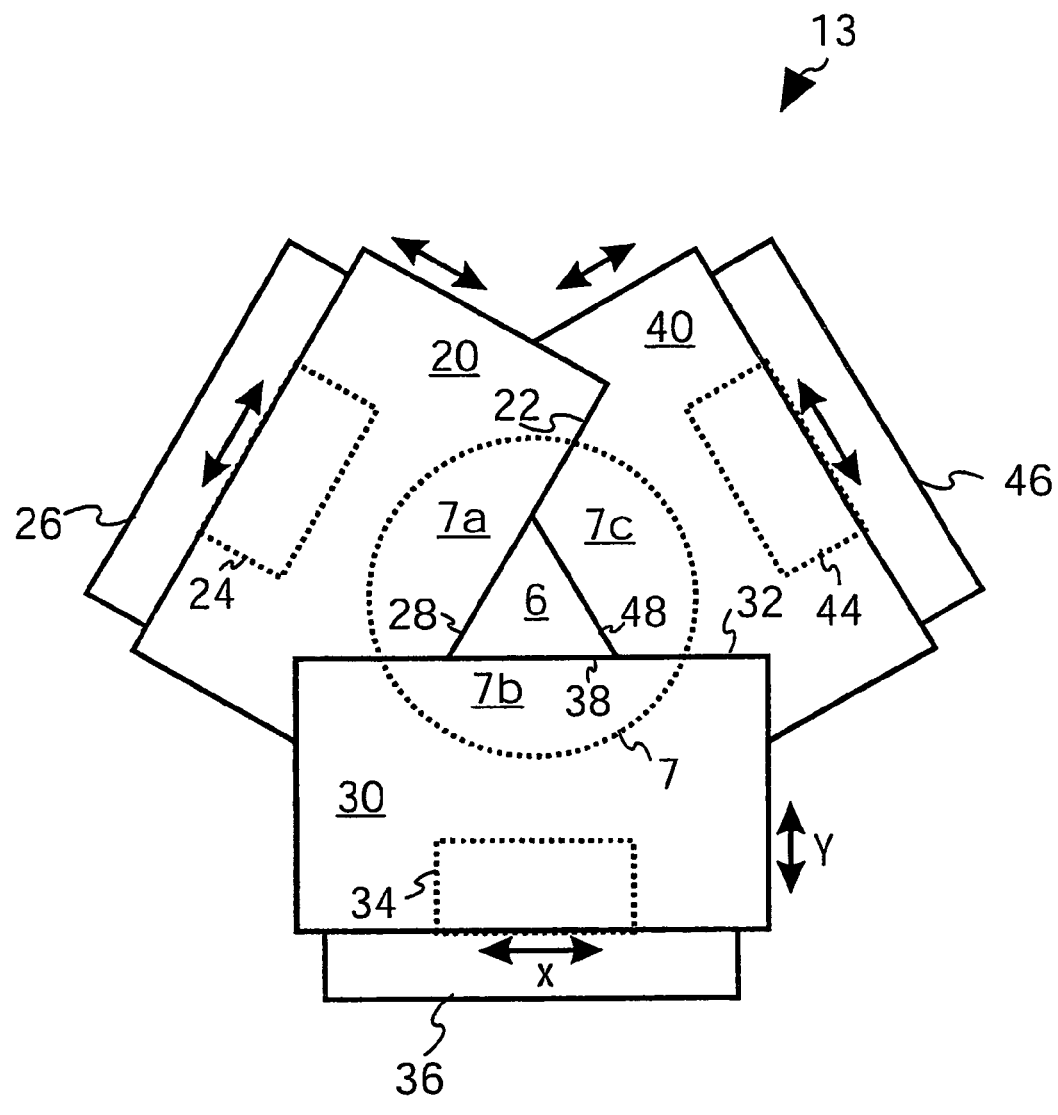
FIG. 7a Triangular aperture system according to the invention.
Figure 7B:
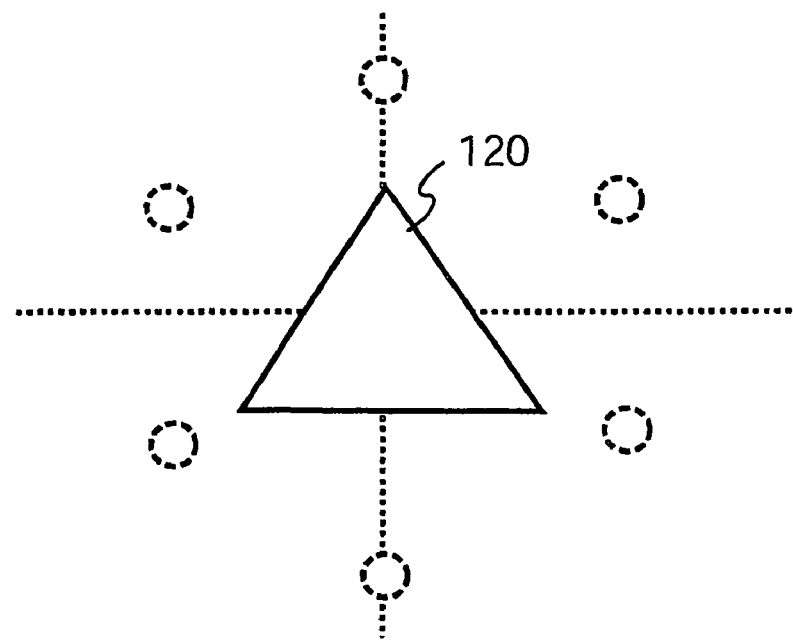
FIG. 7b Beam spot with triangular aperture system and a magnetic hexapole component switched off.
Figure 7C:
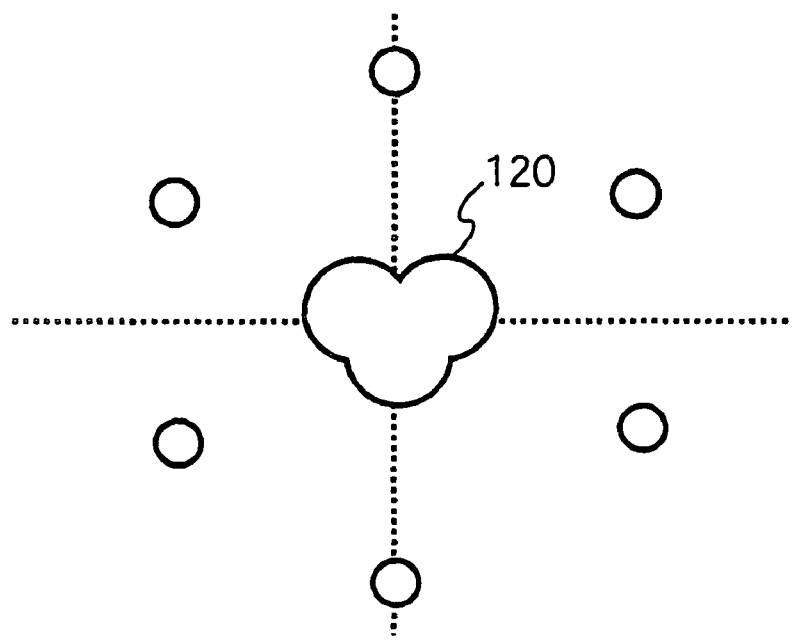

FIGS. 7a-c demonstrate a focussing concept similar to the one of FIG. 6a-c, with the difference that the aperture 6 of the charged particle beam device is formed of three edges 22, 32, 42, instead of four, and that instead of a magnetic octupole 101, a magnetic or electric hexapole is used. FIG. 7a shows the aperture system 13 with the members 20, 30, 40 moved to form a triangular shaped aperture 6 and, in addition, aligned to the optical axis 8 of the charged particle beam 7.

Preferably, first, second and/or third edges 22, 32, 33 of the first, second and third members 20, 30, 40 are essentially linear. This way, it is possible to move the members 20, 30, 40 in the direction of the respective edges 22, 32, 42 without changing the aperture shape. This allows for a "cleaning" of the aperture boundaries 28, 38, 48 without changing the shape of the aperture 6. Further, it is preferred that first, second and third members 20, 30, 40 are oriented in a way that the respective edges 22, 32, 42 form an aperture 6 of essentially equilateral triangled shape. This helps to maximize the rotational symmetry with respect to the beam optical axis. In the example of FIG. 7a, first member 20, in the projection along the beam axis, is located between second and third members 30, 40 with the second member closest to the charged particle beam source. Further, each member 20, 30, 40 is independently movably connected to the respective stages 26, 36, 46 in two orthogonal directions in order to adjust the size of the aperture 6, align the aperture 6 to the charged particle beam 7 and to "clean" the edges.

With a triangular shaped aperture 6, the beam spot 120 of the charged particle beam is shaped like a triangle, as shown in FIG. 7b. The size of the beam spot can 120 further be reduced if a magnetic and/or electric hexapole field generated by a magnetic and/or electric hexapole is applied to the charged particle beam 7. As it turns out, the magnetic and/or electric hexapole field is capable of deflecting the electrons of the charged particle beam 7 in a way that leads to a rounding of the three corners of the triangular shaped beam spot 120, which in turn reduces the size of the beam spot.

The magnetic and/or electric hexapole, like the magnetic octupole 101 of FIG. 6a, may be positioned anywhere within the charged particle beam 7 to provide for a reduction of the beam spot size. However, it is generally preferred that the hexapole is positioned in regions of the charged particle beam 7 where the beam has a large cross section. Therefore, it is preferred that the magnetic and/or electric hexapole is positioned in the region between the aperture system 13 and specimen 3 or, even better, nearby or within the focussing lens 9.

FIGS. 7b and 7c show the beam spots 120 with the aperture system 13 of FIG. 7a with a magnetic or electric hexapole component switched off (FIG. 7b) and switched on (FIG. 7c). As expected, the beam spot 120 with the hexapole component switched off has the shape of aperture 6 of FIG. 7a, i.e. it is triangular. With the hexapole component switched on, however, the three corners of the beam spot 120 of FIG. 7b become rounded which in turn reduces the size of the beam spot 120. This further improves the spatial resolution of the charged particle beam device for scanning or structuring a specimen.

The invention claimed is:

1. A charged particle beam device for inspecting or structuring a specimen comprising:
    a charged particle beam source to generate a charged particle beam;
    a focussing lens to focus the charged particle beam onto the specimen; and
    an aperture system for defining an aperture for the charged particle beam, the aperture system comprising:
        a first member to block a first portion of the charged particle beam between the charged particle beam source and the focussing lens;
        a second member to block a second portion of the charged particle beam between the charged particle beam source and the focussing lens;
        first means for moving the first member to adjust a size of a blocked first portion of the charged particle beam;

second means for moving the second member independently of the first member, wherein the first member and the second member have a respective first edge and a second edge capable of defining a respective first boundary and a second boundary of the aperture, the first edge is a first lateral edge and the second edge is a second lateral edge, and the first means and second means for moving the members are each capable of moving the respective member independently in two orthogonal directions;

a third, a fourth, a fifth, a sixth, a seventh or an eighth members to selectively block respective third, fourth, fifth, sixth, seventh or eighth portions of the charged particle beam between the charged particle beam source and the focussing lens; and a third, a fourth, a fifth, a sixth, a seventh or an eighth means for moving the respective third, fourth, fifth, sixth, seventh or eighth members to adjust sizes of the blocked respective third, fourth, fifth, sixth, seventh or eighth portions of the charged particle beam between the charged particle beam independently.

2. The charged particle beam device according to claim 1, wherein the first edge or the second edge is shaped to provide a first boundary or a second boundary which extend essentially linearly.

3. The charged particle beam device according to claim 1, wherein the first edge and the second edge are shaped to provide a first boundary and a second boundary which extend essentially in parallel.

4. The charged particle beam device according to claim 1, wherein the first edge or the second edge is shaped to provide an angled or rounded first or second boundary.

5. The charged particle beam device according to claim 1, wherein the first means or the second means for moving the respective first or the second member is capable of moving the respective first edge or second edge without changing the shape of the aperture.

6. The charged particle beam device according to claim 1, wherein the first means or the second means for moving the respective first or second member each include a respective first motor or a second motor.

7. The charged particle beam device according to claim 1, wherein the third, fourth, fifth, sixth, seventh or eighth member have respective third, fourth, fifth, sixth, seventh or eighth edges, which are lateral edges, capable of defining respective third, fourth, fifth, sixth, seventh or eighth boundaries of the aperture.

8. The charged particle beam device according to claim 7, wherein the third, fourth, fifth, sixth, seventh or eighth edge is shaped to provide a respective third, fourth, fifth, sixth, seventh or eighth boundary which extends essentially linearly.

9. The charged particle beam device according to claim 7, wherein a third, a fourth, a fifth, a sixth, a seventh or an eighth means for moving the respective third, fourth, fifth, sixth, seventh or eighth member are each capable of moving the respective third, fourth, fifth, sixth, seventh or eighth edges without changing the shape of the aperture.

10. The charged particle beam device according to claim 7, wherein the third edge and the fourth edge, the fifth edge and the sixth edge or the seventh edge and the eighth edge pairwise extend essentially in parallel with a tolerance of less than 10 degrees.

11. The charged particle beam device according to claim 1, wherein the first, second, fourth, fifth, sixth, seventh or eighth means for moving the respective first, second, fourth, fifth, sixth, seventh or eighth members are capable of moving the respective member with steps having a step size smaller than 10 µm.

12. The charged particle beam device according to claim 1, wherein the first, second, third, fourth, fifth, sixth, seventh or eighth means for moving the respective first, second, third, fourth, fifth, sixth, seventh or eighth member include a respective first, second, third, fourth, fifth, sixth, seventh or eighth motor.

13. The charged particle beam device according to claim 1, wherein the charged particle beam device includes a scanning unit (17) to scan the charged particle beam across the specimen.

14. The charged particle beam device according to claim 1, wherein the charged particle beam device is an electron beam device or a focussing ion beam device.

15. The charged particle beam device according claim 1, wherein the charged particle beam device further comprising a magnetic octupole component or an electrostatic octupole component.

16. The charged particle beam device according claim 1, wherein the charged particle beam device further comprising a magnetic hexapole component or an electrostatic hexapole component to shape the charged particle beam.

17. The charged particle beam device according claim 1 further having the first, second and third members oriented to define a triangular aperture for the charged particle beam.

18. The charged particle beam device according claim 1, wherein each of the first, second, third, fourth, fifth, sixth, seventh or eighth means for moving the respective first, second, third, fourth, fifth, sixth, seventh or eighth member each include a respective first motor and a second motor for driving the respective members in a first direction and a second direction.

19. The charged particle beam device according claim 1, wherein the first lateral edge and second lateral edge are outer circumferential edges of the aperture.

20. Method for focussing a charged particle beam onto a specimen comprising:

providing a charged particle beam device wherein the charged particle beam comprises:
 a charged particle beam source to generate a charged particle beam;
 a focussing lens to focus the charged particle beam onto a specimen; and
 an aperture system for defining an aperture for the charged particle beam;
the aperture system comprising:
 a first member to block a first portion of the charged particle beam between the charged particle beam source and the focussing lens;
 a second member to block a second portion of the charged particle beam between the charged particle beam source and the focussing lens, wherein the first member and the second member have a respective first edge and a second edge capable of defining a respective first boundary and a second boundary of the aperture, the first edge is a first lateral edge, and the second edge is a second lateral edge;
 first means for moving the first member to adjust a size of the blocked first portion of the charged particle beam;
 second means for moving the second member independently of the first member, wherein the first means and second means are each capable of moving the respective member independently in two orthogonal directions;
 a third, a fourth, a fifth, a sixth, a seventh or an eighth members to selectively block respective third, fourth, fifth, sixth, seventh or eighth portions of the charged particle beam between the charged particle beam source and the focussing lens; and
 a third, a fourth, a fifth, a sixth, a seventh or an eighth means for moving the respective third, fourth, fifth, sixth, seventh or eighth members to adjust sizes of the blocked respective third, fourth, fifth, sixth, seventh or eighth portions of the charged particle beam between the charged particle beam independently;

generating the charged particle beam;

passing the charged particle beam through a rectangular shaped aperture;

passing the charged particle beam through a magnetic or electric octupole field; and directing the charged particle beam onto the specimen.

21. Method for focussing a charged particle beam onto a specimen comprising:

providing a charged particle beam device, wherein the charged particle beam comprises:

a charged particle beam source to generate a charged particle beam;

a focussing lens to focus the charged particle beam onto a specimen; and an aperture system for defining an aperture for the charged particle beam;

the aperture system comprising:

a first member to block a first portion of the charged particle beam between the charged particle beam source and the focussing lens;

a second member to block a second portion of the charged particle beam between the charged particle beam source and the focussing lens, wherein the first member and the second member have a respective first edge and a second edge capable of defining a respective first boundary and a second boundary of the aperture, the first edge is a first lateral edge, and the second edge is a second lateral edge;

first means for moving the first member to adjust a size of the blocked first portion of the charged particle beam; and second means for moving the second member independently of the first member, wherein the first means and second means for moving members are each capable of moving the respective member independently in two orthogonal directions;

a third, a fourth, a fifth, a sixth, a seventh or an eighth members to selectively block respective third, fourth, fifth, sixth, seventh or eighth portions of the charged particle beam between the charged particle beam source and the focussing lens; and a third, a fourth, a fifth, a sixth, a seventh or an eighth means for moving the respective third, fourth, fifth, sixth, seventh or eighth members to adjust sizes of the blocked respective third, fourth, fifth, sixth, seventh or eighth portions of the charged particle beam between the charged particle beam independently;

generating the charged particle beam;

passing the charged particle beam through a triangular shaped aperture;

passing the charged particle beam through a magnetic or electric hexapole field; and directing the charged particle beam onto the specimen.

* * * * *

UNITED STATES PATENT AND TRADEMARK OFFICE
CERTIFICATE OF CORRECTION

PATENT NO. : 7,763,866 B2
APPLICATION NO. : 10/576547
DATED : July 27, 2010
INVENTOR(S) : Frosien et al.

It is certified that error appears in the above-identified patent and that said Letters Patent is hereby corrected as shown below:

In the Description of the Preferred Embodiments:

Column 7, Line 46, please delete "filly" and insert --fully-- therefor;

Column 9, Line 21, please delete "34bin" and insert --34b in-- therefor;

Column 9, Line 23, please delete "piezodrives" and insert --piezo-drives-- therefor.

Signed and Sealed this

Thirtieth Day of November, 2010

David J. Kappos
*Director of the United States Patent and Trademark Office*